(12) United States Patent
Brooks et al.

(10) Patent No.: US 11,460,173 B1
(45) Date of Patent: Oct. 4, 2022

(54) LED BACKLIGHT SYSTEM AND MOUNTING SYSTEM

(71) Applicant: BrooksCo, LLC, Wheat Ridge, CO (US)

(72) Inventors: David Brooks, Arvada, CO (US); Yulin Xu, Shiyan Town (CN); Zhisheng Zhou, Shiyan Town (CN); Bing Wen, Shiyan Town (CN)

(73) Assignee: BROOKSCO, LLC, Wheat Ridge, CO (US)

( * ) Notice: Subject to any disclaimer, the term of this patent is extended or adjusted under 35 U.S.C. 154(b) by 0 days.

(21) Appl. No.: 17/569,471

(22) Filed: Jan. 5, 2022

Related U.S. Application Data

(60) Provisional application No. 63/134,105, filed on Jan. 5, 2021.

(51) Int. Cl.
  *F21V 19/00* (2006.01)
  *F21V 23/00* (2015.01)
  (Continued)

(52) U.S. Cl.
  CPC ............ *F21V 19/003* (2013.01); *F21K 9/235* (2016.08); *F21S 2/005* (2013.01); *F21S 4/28* (2016.01);
  (Continued)

(58) Field of Classification Search
  CPC ........ F21V 19/003; F21V 23/06; F21S 2/005; F21S 4/28
  See application file for complete search history.

(56) References Cited

U.S. PATENT DOCUMENTS

| 7,880,831 B2 | 2/2011 | Hsiao |
| 8,307,547 B1 | 11/2012 | Cobb |

(Continued)

FOREIGN PATENT DOCUMENTS

| CN | 202275568 U | 6/2012 |
| CN | 101887664 B | 8/2012 |

(Continued)

OTHER PUBLICATIONS

Bitro Group Inc., "The Lattice, LAT50S-50, LED Matrix Lighting System for Sign Cabinets" datasheet (May 2013) [2 pages, resubmitted from first IDS].

(Continued)

*Primary Examiner* — Karabi Guharay
(74) *Attorney, Agent, or Firm* — Polson Intellectual Property Law, PC; Margaret Polson; Christopher Sylvain

(57) ABSTRACT

Rack-type backlight light emitting element (LEE) printed circuit boards (PCBs) with at least two layers to provide redundant current paths. This enables a PCB strip to be broken at designated perforations in the field in order to accommodate pipes or fixtures that require formation of a gap in the rack array. The entire length and width of an array can be sized in the field. A plurality of PCB arrays can be serially chained together with the system. A chain of PCB strips is snapped into clips, which in turn snap into rails that are fastened to a surface. The mounting system includes various types of clips, such as end clips, clips for different LEE patterns on the PCBs, and mounting clips to secure the rails to a surface.

20 Claims, 27 Drawing Sheets

(51) Int. Cl.
*F21S 2/00* (2016.01)
*F21V 23/06* (2006.01)
*F21K 9/235* (2016.01)
*F21S 4/28* (2016.01)
*F21Y 115/10* (2016.01)

(52) U.S. Cl.
CPC ............ *F21V 23/005* (2013.01); *F21V 23/06* (2013.01); *F21Y 2115/10* (2016.08)

(56) References Cited

U.S. PATENT DOCUMENTS

| | | | |
|---|---|---|---|
| 9,275,980 | B2 | 3/2016 | Groenendaal et al. |
| 9,797,559 | B2 | 10/2017 | Sellam |
| 9,839,084 | B2 | 12/2017 | Palfreyman et al. |
| 9,865,185 | B2 | 1/2018 | Lee |
| 9,867,244 | B2 | 1/2018 | Palfreyman et al. |
| 10,475,359 | B2 | 11/2019 | Lee |
| 10,665,139 | B2 | 5/2020 | Lee |
| 10,690,302 | B1 | 6/2020 | Brooks et al. |
| 11,193,635 | B2 | 12/2021 | Brooks et al. |
| 2003/0112627 | A1 | 6/2003 | Deese |
| 2004/0233671 | A1 | 11/2004 | Staufert |
| 2005/0221659 | A1 | 10/2005 | Mrakovich et al. |
| 2005/0251698 | A1 | 11/2005 | Lynch et al. |
| 2007/0002590 | A1 | 1/2007 | Jang et al. |
| 2008/0100773 | A1 | 5/2008 | Hwang et al. |
| 2008/0259240 | A1 | 10/2008 | Song et al. |
| 2009/0267533 | A1 | 10/2009 | Lee |
| 2010/0134711 | A1 | 6/2010 | Park |
| 2010/0220046 | A1 | 9/2010 | Plotz et al. |
| 2011/0019413 | A1 | 1/2011 | Zimmerman et al. |
| 2011/0286207 | A1 | 11/2011 | Chan et al. |
| 2012/0063133 | A1 | 3/2012 | Takeuchi et al. |
| 2012/0212682 | A1 | 8/2012 | Kuromizu |
| 2015/0092413 | A1 | 4/2015 | Li et al. |
| 2016/0174321 | A1 | 6/2016 | Mason et al. |
| 2017/0254518 | A1 | 9/2017 | Vasylyev |
| 2019/0032870 | A1 | 1/2019 | Qiu et al. |
| 2019/0056078 | A1 | 2/2019 | Bergman et al. |
| 2021/0273391 | A1* | 9/2021 | Daniels ................ H01R 12/737 |

FOREIGN PATENT DOCUMENTS

| | | |
|---|---|---|
| CN | 202487084 U | 10/2012 |
| CN | 202511139 U | 10/2012 |
| CN | 202546655 U | 11/2012 |
| CN | 107448826 A | 12/2017 |

OTHER PUBLICATIONS

Environmental Lights, "Performance 160 Degree Cuttable LED Lattice—4,000K—96cm× 104cm" webpage, last accessed May 11, 2022 at <https://www.environmentallights.com/18764-4000k-2835pl-It160-14-6-96x104.html> [2 pages].

Environmental Lights, "Performance 160 Degree Cuttable LED Lattice" reference sheet, last accessed May 11, 2022 at<https://www.environmentallights.com/18764-4000k 2835pl-It160 14-6-96x104.html> [4 pages].

Environmental Lights, "xxxK-2835PL-LT160-14-6-96x104" drawing sheet, last accessed May 11, 2022 at <https://www.environmentallights.com/18764-4000k-2835pl-It160-14-6-96x104.html> [1 page].

Maxbrite LED Lighting Technology, "The Aladdin System" specification sheet (2014) [5 pages].

CPD Lighting, "Custom Size—LED Lattice System—Ladder Lights" webpage, last accessed May 11, 2022 at <https://cpdlighting.com/specialty-led-items/led_lattice_system/> [6 pages].

CPD Lighting, "CLS System" specification sheet, last accessed May 11, 2022 at <https://cpdlighting.com/specialty-led-items/led_lattice_system/> [2 pages].

LED Cool Lights, "4250K LED Lattice Ladder Lights—(Cuttable Every LED)" webpage, last accessed May 11, 2022 at <https://www.ledcoollights.com/products/4250K-LED-LATTICE-LADDER-LIGHTS-CUTTABI F-EVERY-LED-p265981575> [2 pages].

LED Cool Lights, "LED Lattice Ladder Lights—Double Sided Curtain—Single Color" webpage, last accessed May 11, 2022 at <https://www.ledcoollights.com/products/LED-LATTICE-LADDER-LIGHTS-DOUBLE-SIDED-CURTAIN-SINGLE-COLOR-p261296790> [2 pages].

Step 1 Dezigns, Inc., "EL-LAD-92X39-140K-12" specification sheet (2020) [2 pages].

Step 1 Dezigns, Inc., "EL-LAD-80X20-RGB-12" specification sheet (2020) [2 pages].

Signworld America, Inc., "LED Ladder Light Set" webpage, last accessed May 11, 2022 at <https://www.signworldamerica.com/LED-Ladder-Light-p/segll01.htm> [9 pages].

Bitro Group Inc., "The Lattice, LED Carpet Matrix Lighting System for Sign Cabinets and Large Light Boxes" pamphlet (2010) [4 pages].

Bitro Group Inc., "The 'Lattice' LED Carpet System" datasheet (2010) [2 pages].

Bitro Group Inc., "Bitro Alpha Slimline Series 24V-100W Class 2 Power Supply" datasheet (2010) [1 page].

Lightboard Technologies, "24 Volt LED Flex Array" datasheet (2011) [1 page].

Bitro Group Inc., "The Lattice Carpet" webpage (Mar. 2011) accessed via The Wayback Machine at <https://web.archive.org/web/20110308170734/http:/bitrogroup.com:80/led_lattice.html> [4 pages].

Bitro Group Inc., "The Lattice, LAT50S-50, LED Matrix Lighting System for Sign Cabinets" datasheet (May 2013) [2 pages].

Xinelam, "LED lattice shutter backlight" webpage (Jun. 2013) accessed via The Wayback Machine at <https://web.archive.org/web/20130629075349/http:hwww.xinelam.com/LED-shutter-backlight.html> [2 pages].

Xinelam, "BKT41S-41-12V, LED lattice—backlight—LED matrix lighting system for Sign Cabinets" datasheet (Jun. 2013) [3 pages].

Lightboard Technologies, "Ultra-Bright LED Flex Array" webpage (Sep. 2013) accessed via The Wayback Machine at <https://web.archive.org/web/20130929031354/http://lightboardtech.com/Products/UttrabrightLEDFlexArrays/tabid/537/Default.aspx> [2 pages].

Lightboard Technologies, "Ultra-Bright LED Strips" webpage (Sep. 2013) accessed via The Wayback Machine at <https://web.archive.org/web/20130929025546/http://lightboardtech.com/Products/UltrabrightLEDStrips/tabid/536/Default.aspx> [2 pages].

Royer, Michael P, "Comparing Measures of Gamut Area", LEUKOS (Nov. 2018), online before print [29 pages] DOI: 10.1080/15502724.2018.1500485.

\* cited by examiner

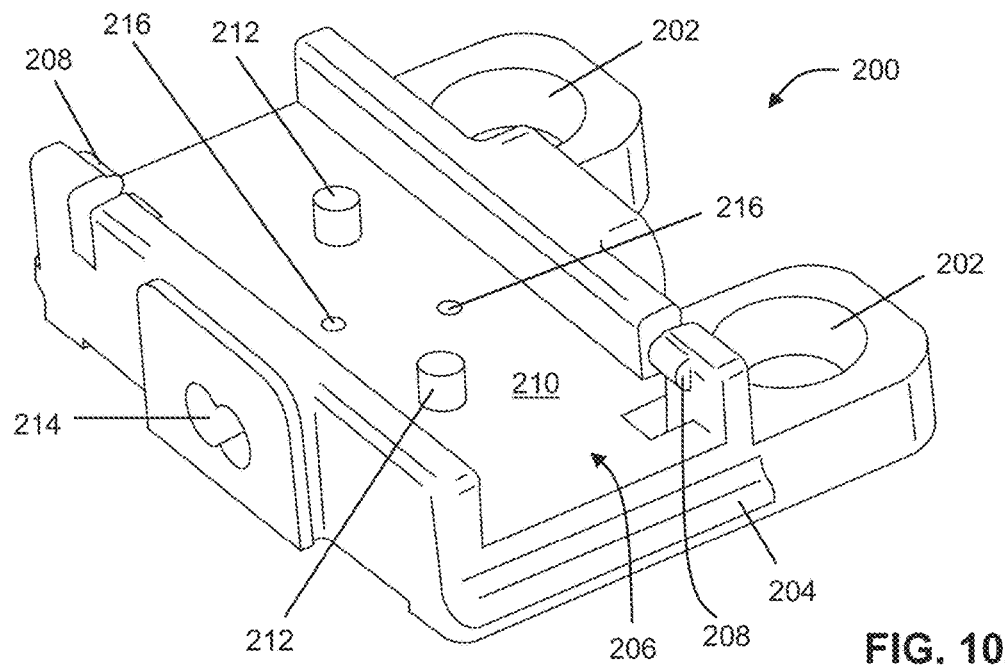
FIG. 10A
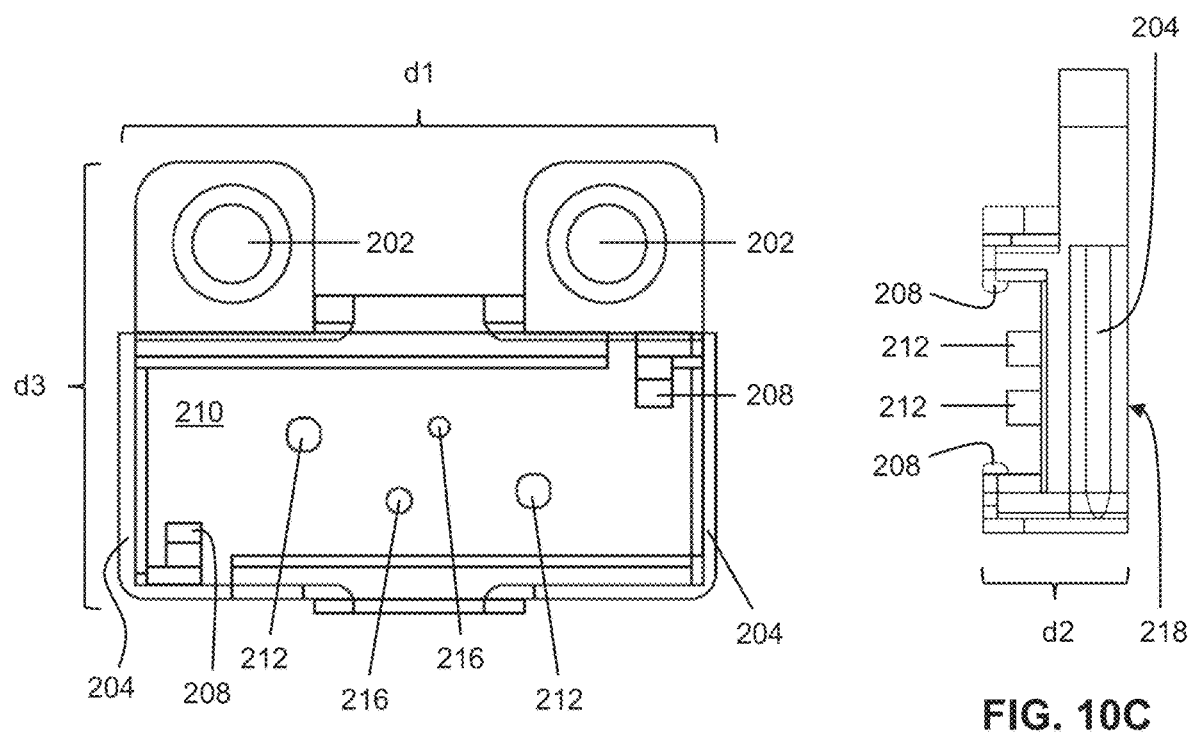
FIG. 10B
FIG. 10C

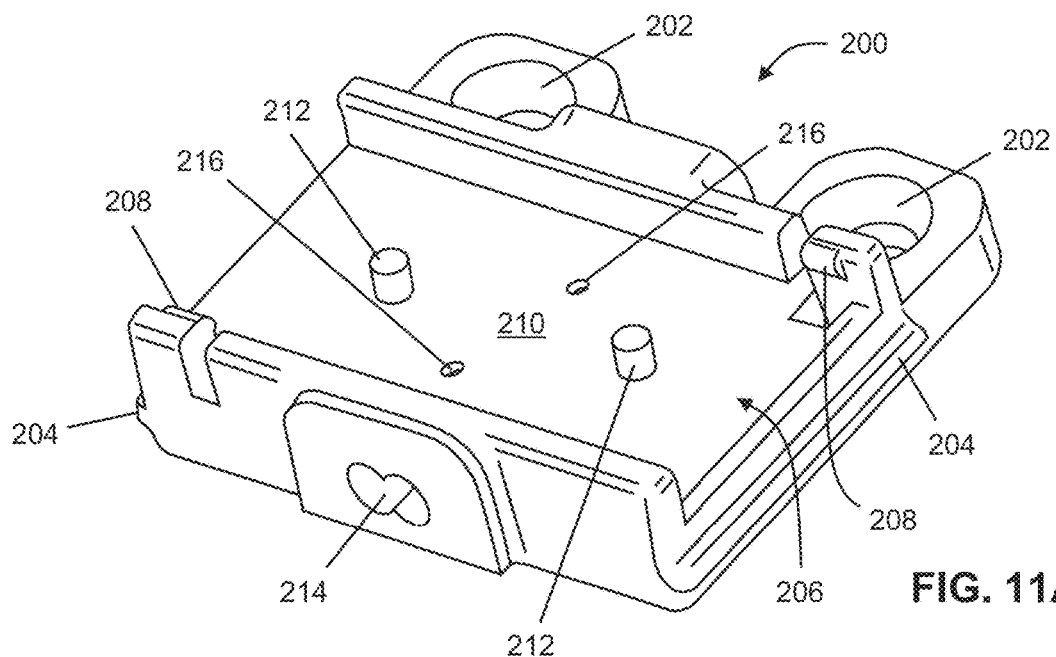
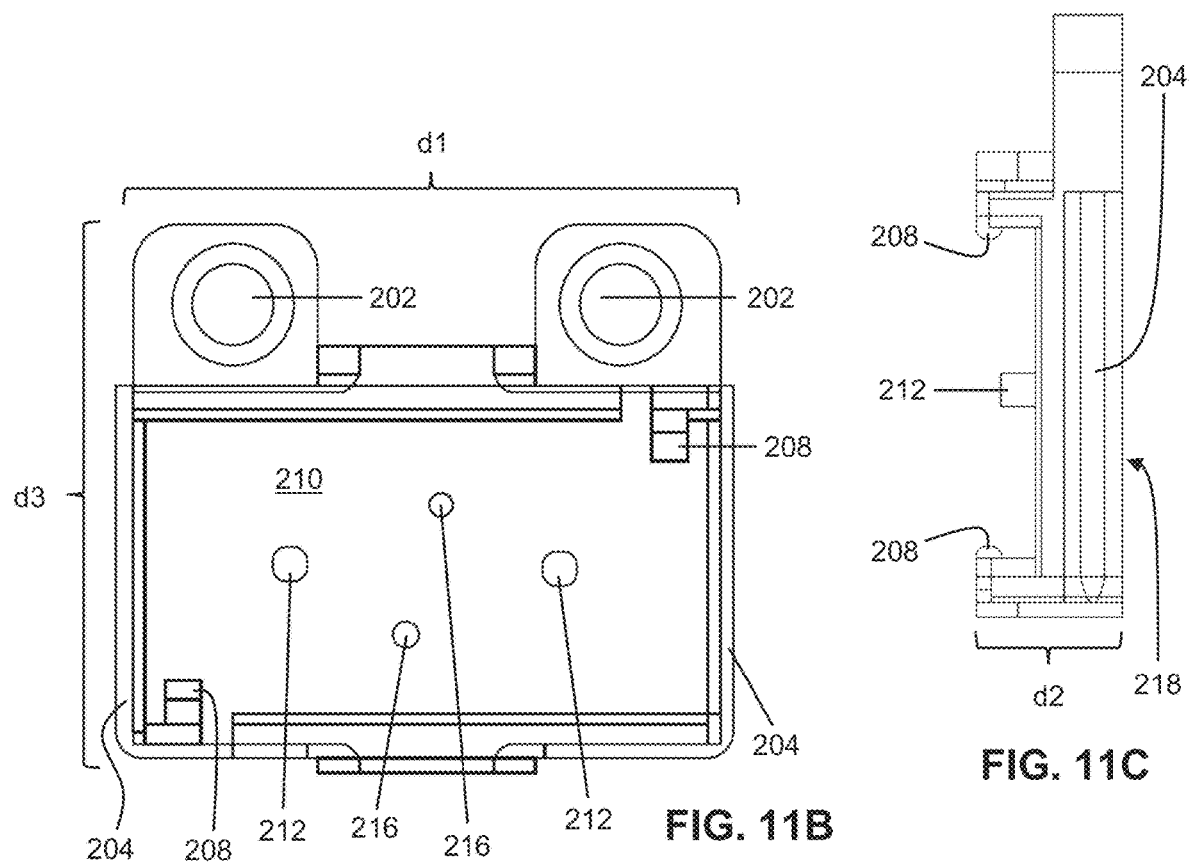
FIG. 11A
FIG. 11B
FIG. 11C

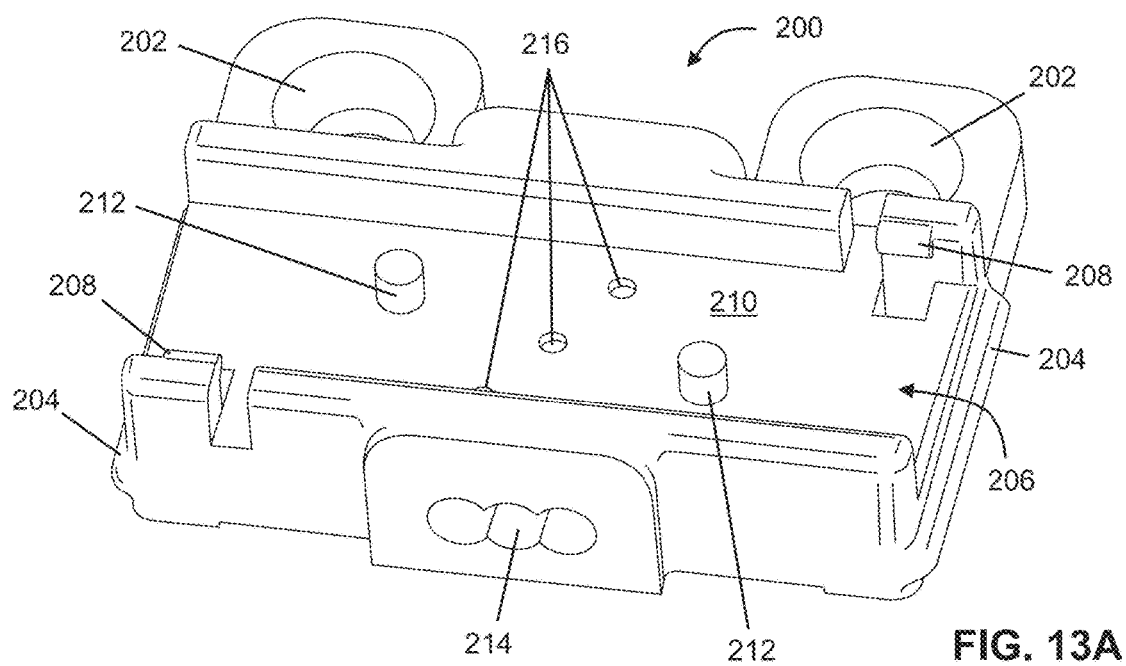
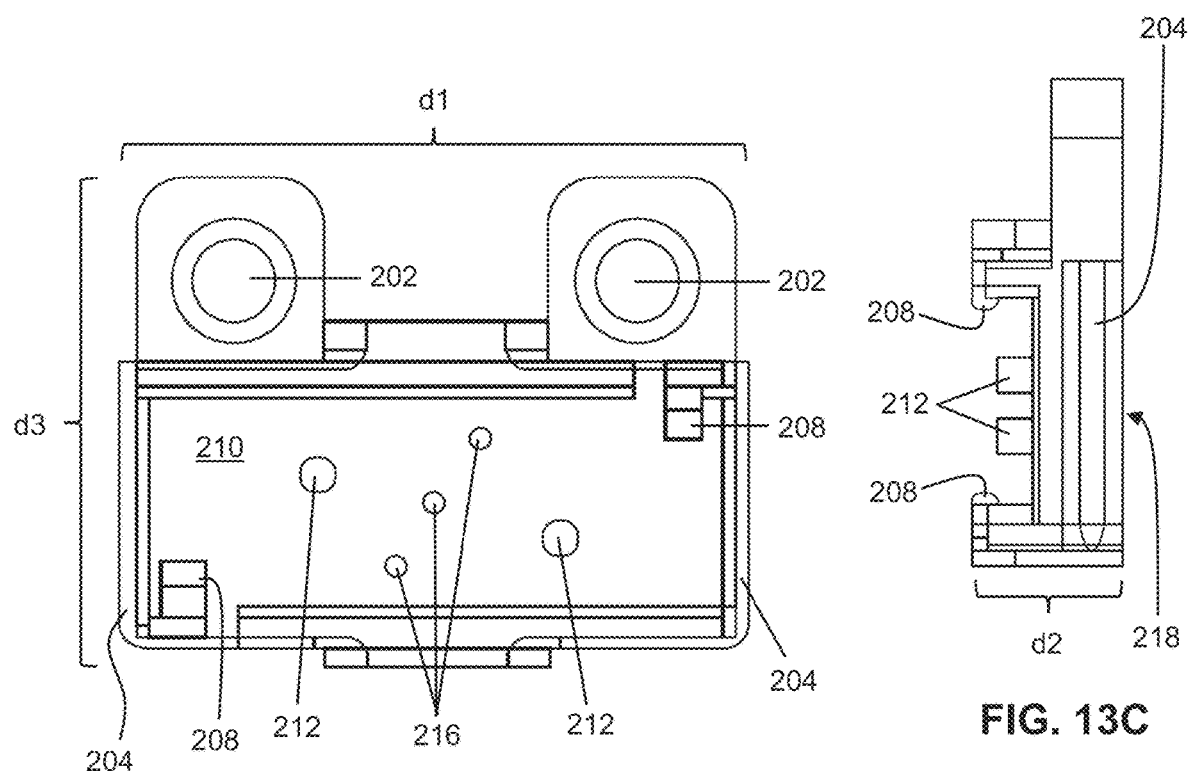
FIG. 13A
FIG. 13B
FIG. 13C

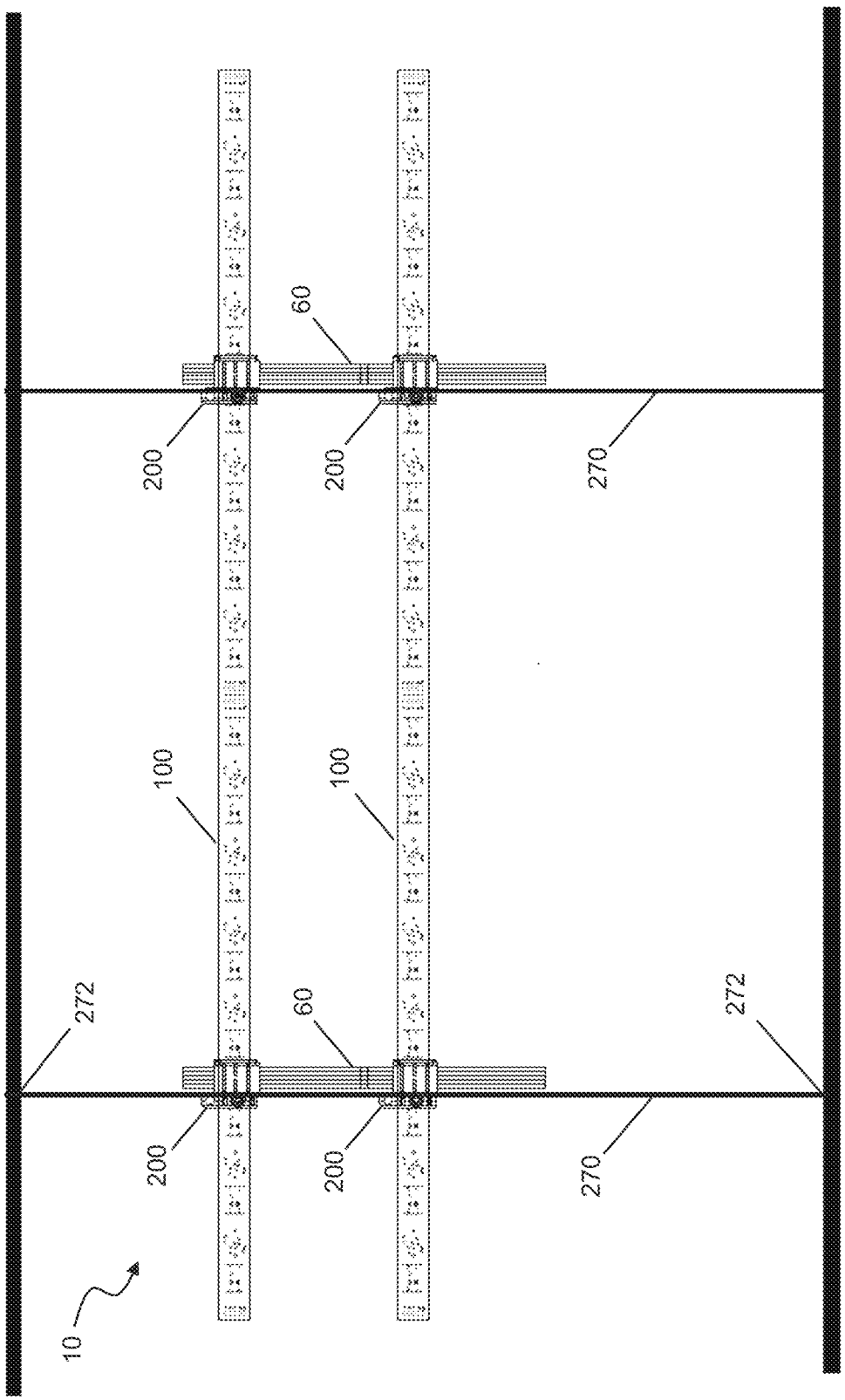

LED BACKLIGHT SYSTEM AND MOUNTING SYSTEM

RELATED APPLICATION

This application claims the benefit of U.S. provisional application No. 63/134,105 filed Jan. 5, 2021, which is incorporated-by-reference herein for all purposes.

BACKGROUND

Light emitting diodes (LEDs) have become standard in the lighting industry. In backlight type installations, the small size and low heat output of LEDs and related lighting products allow a large number of design possibilities that would have been very difficult or very expensive to achieve with incandescent or fluorescent lighting options. However, current types of installations for backlight LED lighting, including lattice, curtain, and ladder mounting, do not allow easy modification of the lighting elements in the field, but instead are manufactured for each particular installation. These units are not easy to modify or customize in the field as needed.

Many applications would benefit from a field modifiable rack of LEDs that can be broken or cut and fitted during the installation process. A complete system of easy-to-use mounting hardware of clips and other accessories to complete a modular design is also desirable.

The foregoing examples of the related art and limitations related therewith are intended to be illustrative and not exclusive. Other limitations will become apparent to those of skill in the art upon a reading of the specification and a study of the drawings.

SUMMARY

The following embodiments and aspects thereof are described and illustrated in conjunction with systems, tool and methods which are meant to be exemplary and illustrative, not limiting in scope. In various embodiments, one or more of the above described problems have been reduced or eliminated, while other embodiments are directed to other improvements.

The present disclosure provides printed circuit boards (PCBs) with perforated or scored break points to allow a wide variety of lengths to be built in the field. The perforated sections may be provided in an array to accommodate other fixtures. The PCBs provide parallel current paths to enable cutouts for this purpose. One or more rails, surface mounting clips, PCB-to-rail clips, rail extension clips, and end caps provide a customizable rack mount for various PCBs.

One aspect is to provide PCBs with duplicate light emitting element (LEE) circuitry separated by break off lines.

Another aspect is to provide surface mountable rails that can form a rack style array of parallel PCBs.

Another aspect is to provide low profile illumination on curved and flat surfaces.

Another aspect is to provide single-person rapid installation via mountable rails to vertical and/or difficult inverted surfaces.

Another aspect is to provide an assortment of accessory clips that attach to the rails to allow a custom formation of a large wall or ceiling backlight array by sizing the rails and the perpendicular rows of PCBs in the field. A system of rails and snap-in illumination strips using clips permit rapid upgrade or color changes for seasonal or special events illumination needs, without requiring tools. Whole rooms used for temporary exhibits or other temporary installments can be rapidly installed and/or modified.

Independent protection for the various systems, embodiments, methods and aspects thereof disclosed herein is expressly reserved.

In addition to aspects and embodiments described above, further aspects and embodiments will become apparent by reference to the accompanying drawings forming a part of this specification wherein like reference characters designate corresponding parts in the several views.

BRIEF DESCRIPTION OF THE DRAWINGS

The following description is provided using example embodiments with reference to the accompanying figures, wherein:

FIG. 10A is a top perspective view of a rail clip for the single-color PCB.

FIG. 10B is a top plan view thereof.

FIG. 10C is a side elevation view thereof.

FIG. 11A is a top perspective view of a rail clip for the single-color PCB with lens.

FIG. 11B is a top plan view thereof.

FIG. 11C is a side elevation view thereof.

FIG. 13A is a top perspective view of a rail clip for the two-color PCB.

FIG. 13B is a top plan view thereof.

FIG. 13C is a side elevation view thereof.

FIG. 30 is a front side view of an example backlight system using vertical cables.

Figure 1A:
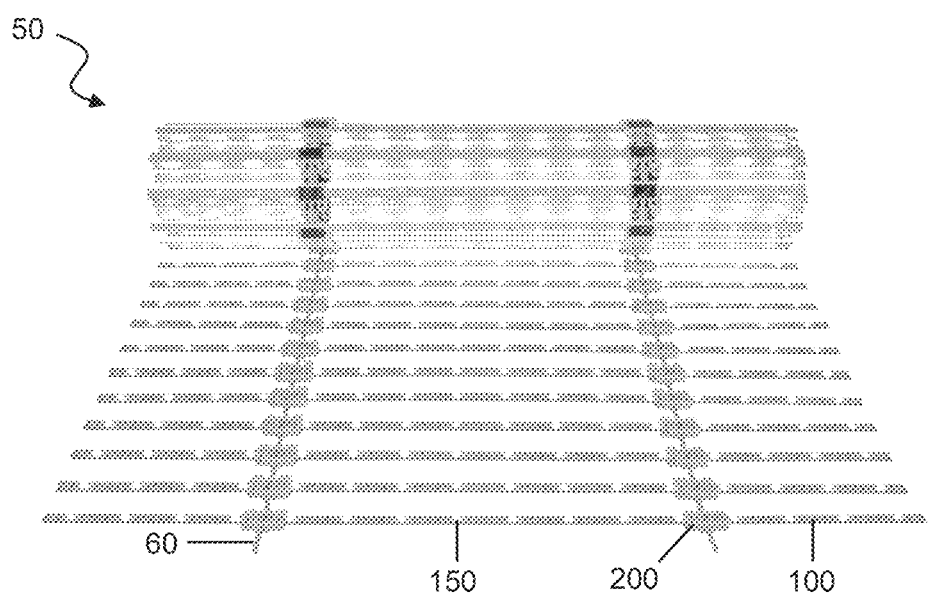
FIG. 1A is a top perspective view of an example PCB array with rail mounting clips.

Before describing the disclosed embodiments, it is to be understood that the invention is not limited in application to the details of the particular arrangements shown in the drawings, since the invention is capable of other embodiments. Embodiments and figures disclosed herein are to be considered illustrative rather than limiting. Also, the terminology used herein is for the purposes of description and not limitation.

DEFINITIONS

AC: alternating current
CW: cool white, white light with spectrum shifted toward blue
DC: direct current
HVAC: heating ventilation air conditioning
IDC: insulation displacement connector
LED: light emitting diode
LEE: light emitting element
PCB: printed circuit board
PLC: power link cable
RGB: red green blue
RGBW: red green blue white
WW: warm white, white light with spectrum shifted toward red

DETAILED DESCRIPTION

Figure 1B:
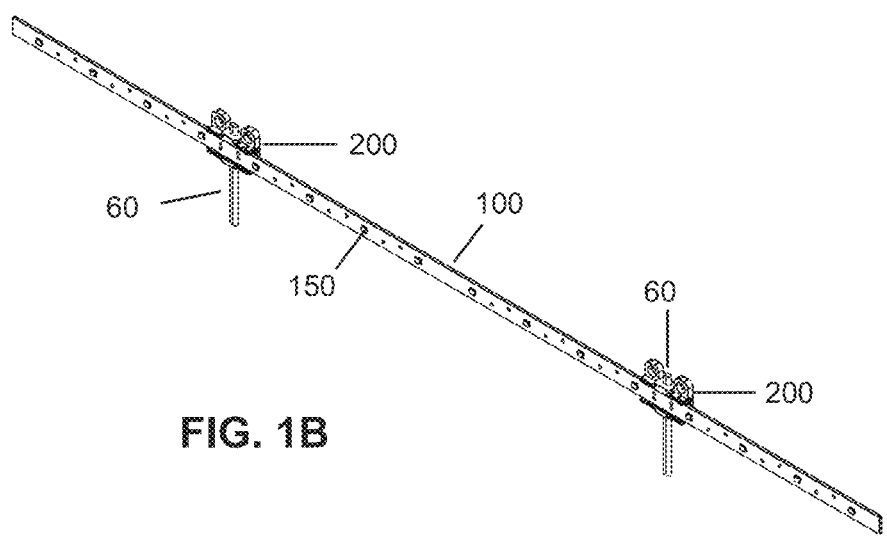
FIG. 1B is a top perspective view of one of the PCBs of the array of FIG. 1A.

FIG. 1A shows an example PCB array 50 comprising a plurality of PCBs 100. The PCBs 100 carry LEEs 150 as described in more detail below. The PCBs 100 are electrically connected via wire conductors 60. The PCBs are pre-mounted to clips 200 for attachment in a rack rail system according to the present disclosure. FIG. 1B shows a single PCB 100 including wire conductors 60 and clips 200 of the array 50. The array 50 in FIG. 1A is shown halfway between a rolled-up state (e.g. for storage or transport) and an unrolled use state.

Figure 2:
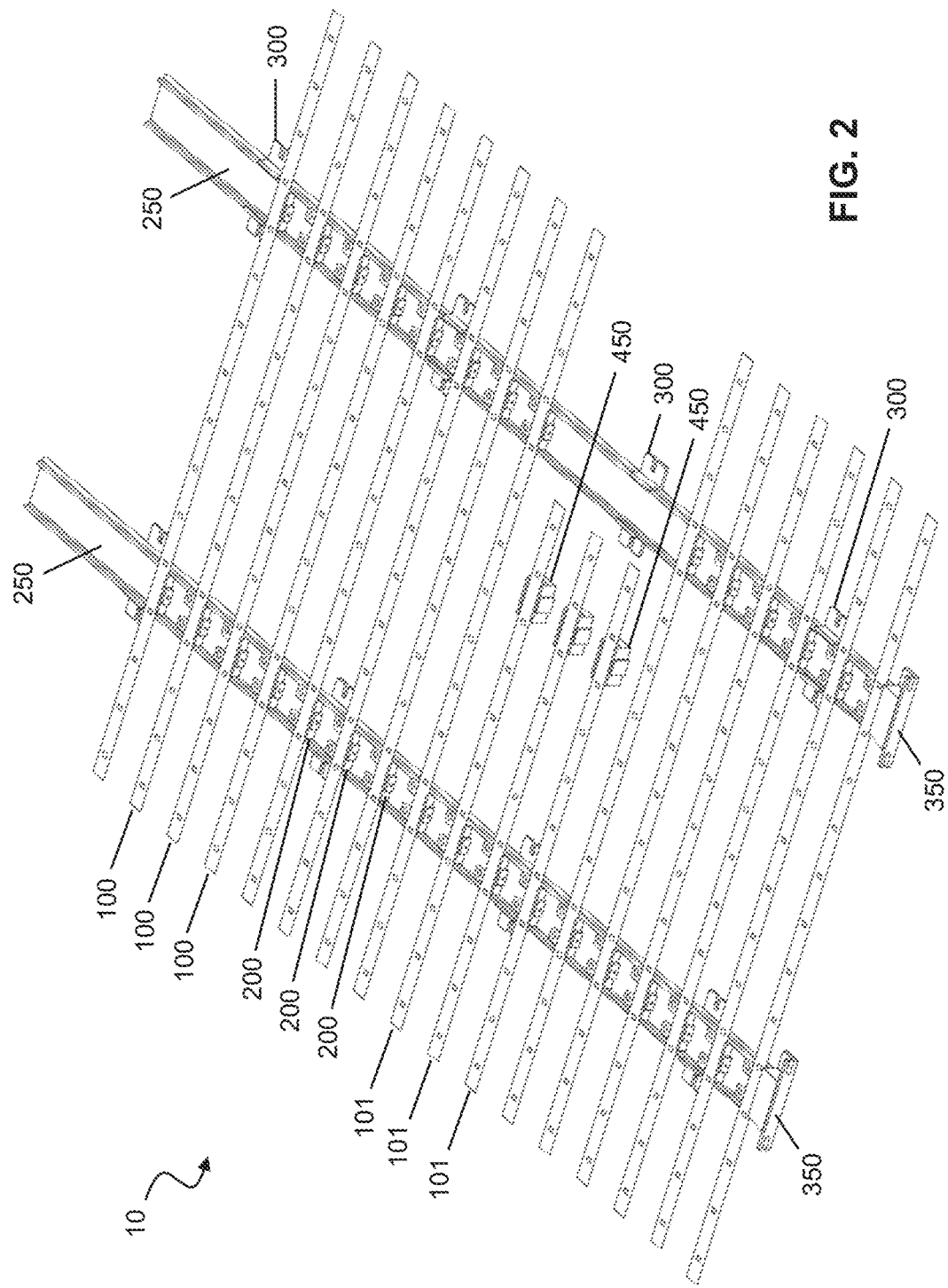
FIG. 2 is a top perspective view of a backlight system with the unrolled PCB array installed in a rack rail mounting system, with wiring omitted for clarity.

FIG. 2 shows a backlight system 10 comprising the array 50 of PCBs 100 installed within a mounting system. The wire conductors 60 have been removed for clarity. The clips 200, which are connected to the PCBs 100, are mounted in rails 250. By way of example only and not limitation, rails 250 may be made from plastic or aluminum. Extruded rails 250 may be trimmed to any length, such as with a handsaw, which can be used to accommodate transitions around corners for example. Preferably, each rail 250 is the same length as the PCB segments 100 for shipping purposes, such as e.g. 24 inches, with additional rails 250 connected in series for particular applications as needed. The rails 250 may be fastened directly to mounting surfaces with fasteners or adhesives. In the depicted example, the rails 250 are attached to the mounting surface via additional mounting clips 300. Prepositioning the clips 300 as a first step facilitates a simple and rapid installation of the rails 200, which can be particularly useful in the case of vertical (e.g. walls) or overhead (e.g. ceilings) installations. End mounting clips 350 for the rails 200 provide further support in vertical or overhead installations. The lightweight rails 250 and PCB assemblies 100 simply snap into their respective clips and are thereby held overhead or in vertical positions. Each of the PCBs 100 may have the same or different types of LEEs, such as with respect to color, luminous intensity, viewing angles, etc. Such various PCB segments 100 are adapted to snap into a common rail design 250 via the mounting clips 200.

If obstacles are encountered, the PCB sections 100 may be trimmed by bending or cutting at periodic perforation lines 120 (see FIG. 3). Such trimmed PCBs 100 are indicated by 101 in FIG. 2. In this case, additional clips 450 may be used to provide extra support to the PCBs 101 trimmed to accommodate one or more obstacles. The height d4 (see FIGS. 20 and 21) between the wall mounting surface and the PCB mounting surface of the clip 450 is substantially the same as the height from the wall mounting surface to the PCB mounting surface of the clips 200 with all intermediary components in place (e.g. rail 250, clip 300). As discussed below, redundant conductor paths allow portions of PCB sections 100 to be removed and power wires 60 to be cut while maintaining illumination to remaining PCB segments. Accordingly, the system 10 can provide uniform large area illumination for customized installations, including the ability to trim PCB strips 100 to avoid obstacles with redundant conductors. Moreover, the system 10 is able to maintain UL Class 2 rating even after such modification. This lightweight system 10 is also simple and quick to install to flat and curved surfaces, including ceilings, walls and HVAC ductwork, using common hand tools.

Figure 3A:
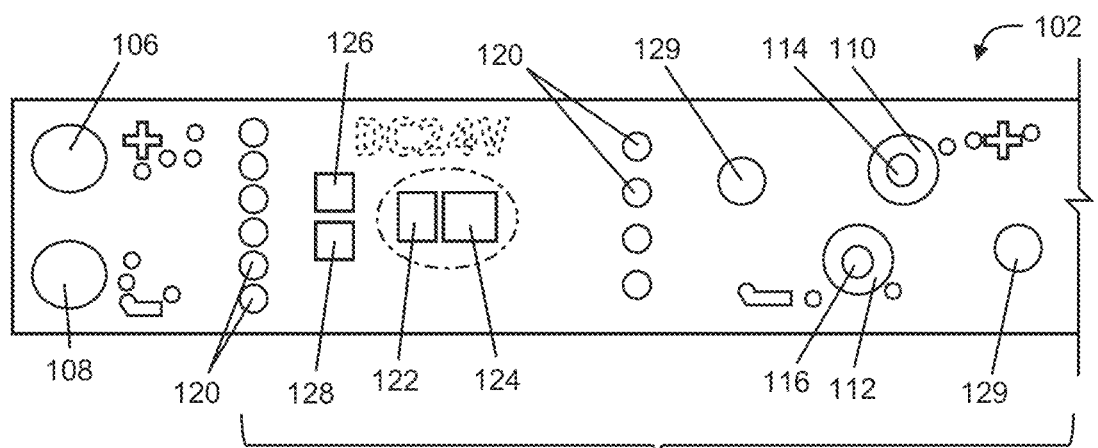
FIG. 3A is a plan view of a section of an outer component layer of a single-color PCB.

FIG. 3A shows an outer component layer 102 of a single-color PCB 100. The outer surface is preferably provided with a conformal coating. The PCB 100 is formed of repeating sections 104 to provide the length of the PCB 100, such as e.g. 24 inches as in the depicted array 50, but any number of repeats may be used to provide a desired length for a given application. Each repeating section includes a LEE 150 and power connection terminals. This figure is an enlarged schematic view of only one section 104 to illustrate individual components of the PCB 100. Solderable pads 106, 108 are optionally provided to connect to external power supply or consumer (not shown). The pads 106, 108 of the circuit enable the user to power other loads off the PCB 100. The pads 106, 108 may be provided at one or more ends of the PCB 100 and/or at any number of intervals between repeating sections 104. In this example, pads 110, 112 allow connection to the positive and return wires of the array via screw fasteners (see FIG. 7A) that provide the power to the circuit. Holes 114, 116 pass through all layers of the PCB 100. Such holes are unthreaded and essentially similar to vias except that the holes receive a conductive member to complete an electrical connection between the PCB 100 and another component, whereas vias as used herein do not. Conductive screws or IDC blades are inserted through holes 114, 116 to mate into holes 216 of the clip 200 and establish an electrical connection with wires 60 (see e.g. FIG. 10A). Mounting or index holes 129 extending through the PCB 100 mate with pins 212 of the mounting clip 200 (see e.g. FIG. 10A). In this example, 24V power is used but other voltages could be used if desired for a given application. Sets of perforations 120 form measured break points along the length of the PCB 100. Variable PCB lengths may be achieved without tools by simply flexing at perforations 120 to snap off a segment. Scoring or other methods of providing measured break points could be used as well. In this example, the perforations 120 extend through the body of the PCB 100 and allow for the user to easily break the circuit and layers. This allows for the length of PCBs 100 to be shortened and shaped to fit the user's needs without compromising the current flowing through the circuit and thus also avoiding the formation of hotspots in the area of illumination of the LEE lights. Solder pads 122, 124 connect to the first and second terminals of the LEE 150 respectively. Solder pads 126, 128 connect to the first and second terminals of the limiting resistor 160 respectively. In this example, the limiting resistor is 430 ohms. Positive supply terminal 106 is in communication with pad 110, conductor 131 of first conductor layer 130 (see FIG. 3B), and first terminal pad 126 of limiting resistor 160 (see FIG. 7A). The second terminal of resistor 160 is soldered to pad 128 which is in communication with conductor 133 of first conductor layer 130 (see FIG. 3B), which conductor 133 is in turn in communication with pad 122 for connection to the first terminal of the LEE 150. The second terminal of LEE 150 is in communication with conductor 132 of the first conductor layer 130 via pad 124.

Figure 3B:
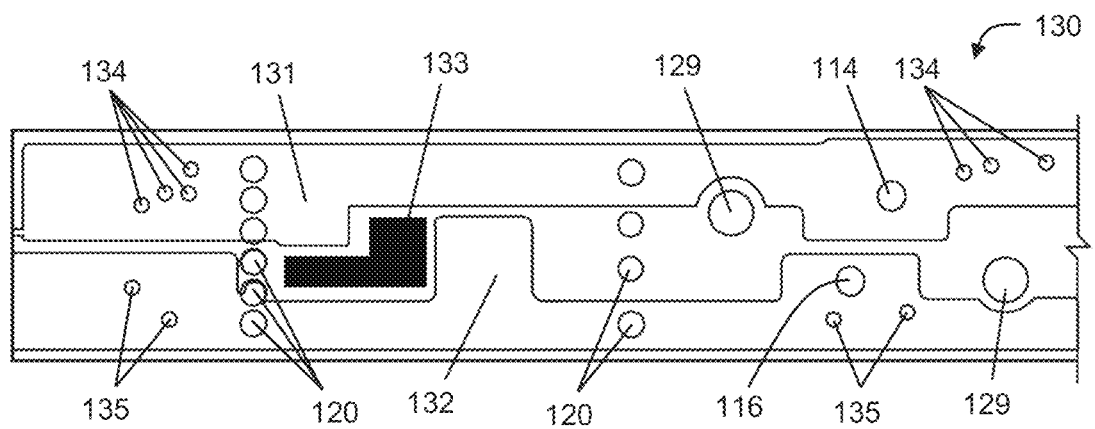
FIG. 3B shows a first conductor layer of the PCB of FIG. 3A.
Figure 3C:
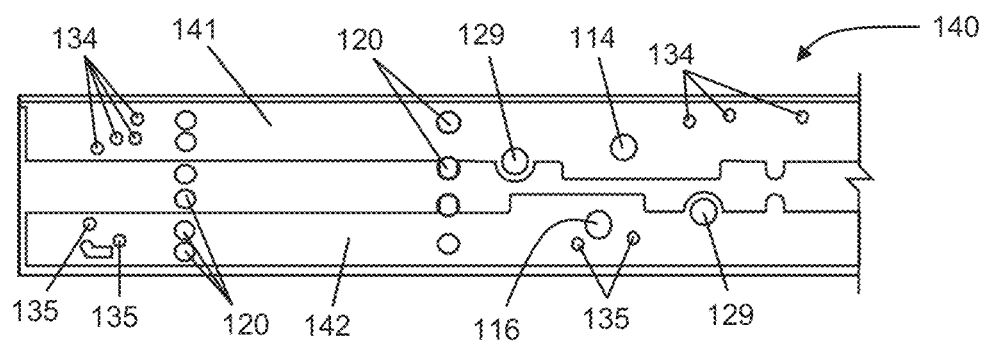
FIG. 3C shows a second conductor layer of the PCB of FIG. 3A.

FIG. 3B shows a first conductive layer 130 of the PCB 100, which is arranged under the outer component surface layer of FIG. 3A. FIG. 3C shows a second conductive layer 140 of the PCB 100, which is arranged under the first layer 130 and separated therefrom by insulating material. The first conductor layer 130 has traces 131, 132 and 133. The second conductor layer 140 has traces 141 and 142. Conductor 131 is galvanically connected to the power source positive through solder pads 106 and 110 throughout the circuit. The conductor trace 131 is also connected to the first terminal of current limiting resistor 160 via solder pad 126. Conductors 131 and 141 allow the positive supply current to connect to the power source via solder pads 106 and 110. Vias 134 connect conductive trace 131 to conductive trace 141. The trace 141 is galvanically connected in parallel with the trace 131 forming a redundant network. Conductor 132 is galvanically connected to the power source negative through solder pads 108 and 112 throughout the circuit. The conductor trace 132 is also connected to the negative terminal end of the LEE 150 via solder pad 124. Conductors 132 and 142 (see FIG. 3C) allows the negative return current to connect to the power source via solder pads 108 and 112. Vias 135 connect conductive trace 132 to conductive trace 142. The trace 142 is galvanically connected in parallel with the trace 132 forming a redundant network. The conductor trace 133 connects the second terminal of the current limiting resistor 160 via solder pad 128 to the positive terminal end of the LEE 150 via solder pad 122. In other words, the trace 133 bridges the connection from the LEE 150 to the current limiting resistor 160 and completes the circuit. Perforations 120 extend through the layers 130, 140 which allow the section 104 to be broken off. Redundant conductive elements permit continued illumination despite deliberate cuts or breaks to the PCB 100. Mounting holes 129 also extend through the layers 130, 140 for attaching to clip 200. FIGS. 3A-3C depict a PCB, conductive traces and solder pads that are, by way of example and not limitation, printed. In alternate embodiments, resistive elements and conductors are directly printed using conductive inks. Electrical configurations for the PCB board and traces that allow for the device to function with breaks in the circuit are elaborated in reference to other figures below.

Figure 4A:
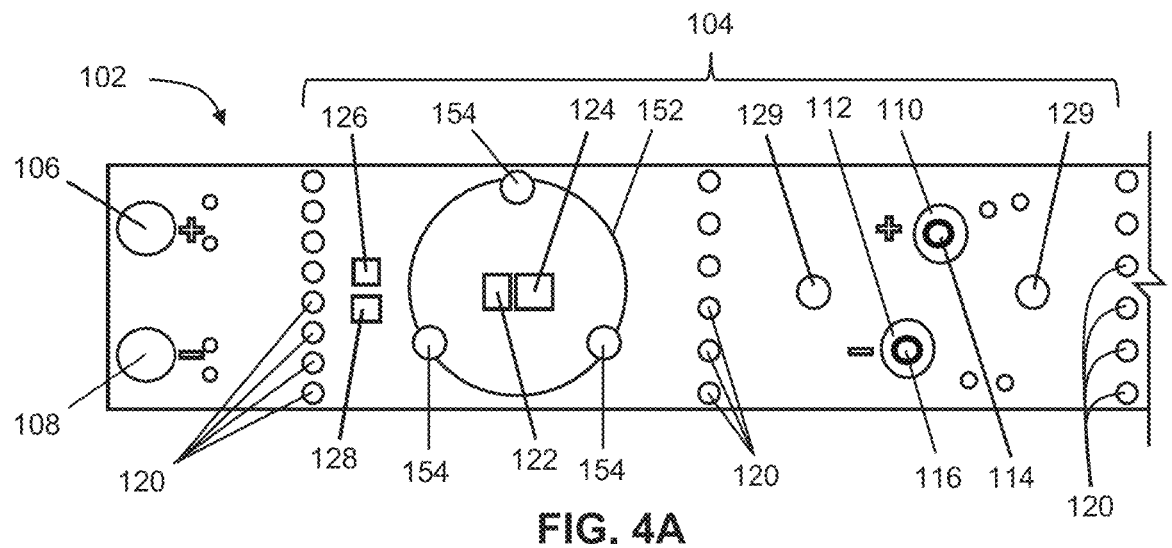
FIG. 4A is a plan view of a section of outer component layer of a single-color PCB with diffuser lens.
Figure 4B:
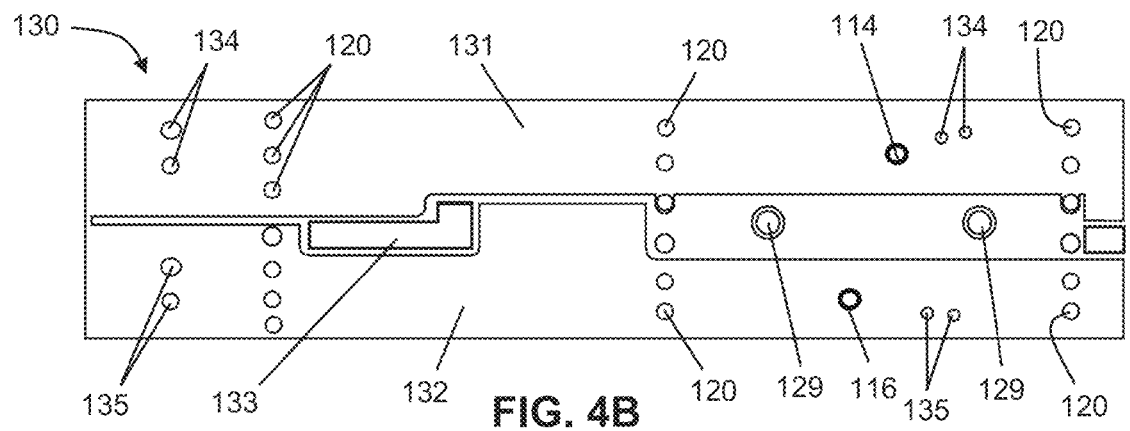
FIG. 4B shows a first conductor layer of the PCB of FIG. 4A.

FIG. 4A shows another outer component layer 102 of a single-color PCB 100 and FIG. 4B shows a first conductor layer 130 thereof. This example is similar to the PCB of FIGS. 3A-C except for the addition of a diffuser lens 155 over the LEE 150 (see FIG. 9). Accordingly, the above descriptions for like elements apply equally here. The redundant second conductive layer of this single-color PCB 100 (not shown) substantially mirrors the second conductive layer 140 of FIG. 3C in general layout, and is electrically connected to the second conductor layer 130 of FIG. 4B through vias 134, 135. As seen in FIG. 4A, the lens profile location is indicated by 152. Attachment points for the lens 155 are indicated by 154. For example, the lens 155 may be attached via white emulsion glue on the PCB 100 at points 154. The white adhesive also acts as a reflector to reduce light loss to the lower lens surface. After the lens attachment is placed accurately, the PCB 100 is then dried to permanently harden the adhesive, such as in an oven for example. This lens configuration improves light dispersion and reduces the appearance of "hot spots" or undesirable visibly brighter areas. The resulting wider, more uniform light dispersion also permits use of thinner, lighter-weight diffuser sheets. An additional aspect is the reduction in distance between light source and diffuser medium, thus enabling the assembled apparatus to be more compact and generally lighter weight. The addition of the lens 155 at location 152 requires the PCB 100 to be a bit wider, generally by a few millimeters, compared to the PCB 100 of FIGS. 3A-3C. The wider PCB does permit better heat removal and thus LEEs may be run at greater power levels while maintaining the same operating temperature. Otherwise, the PCB circuitry design and electrical operation is essentially the same as the PCB of FIGS. 3A-3C.

Figure 5A:
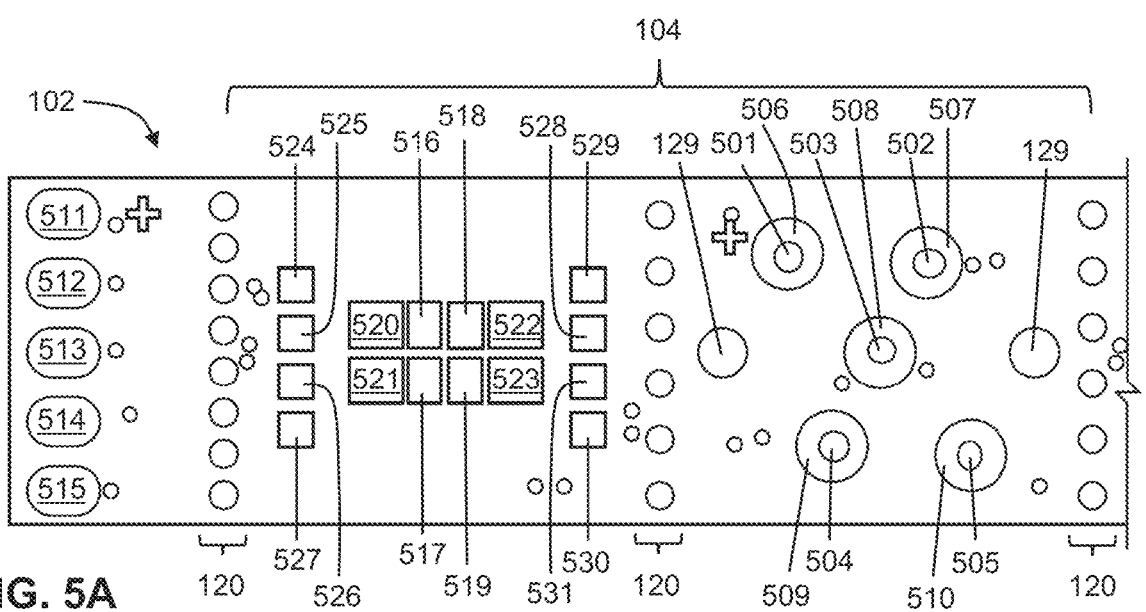
FIG. 5A is a plan view of a section of outer component layer of a multicolor (RGBW) PCB.
Figure 5B:
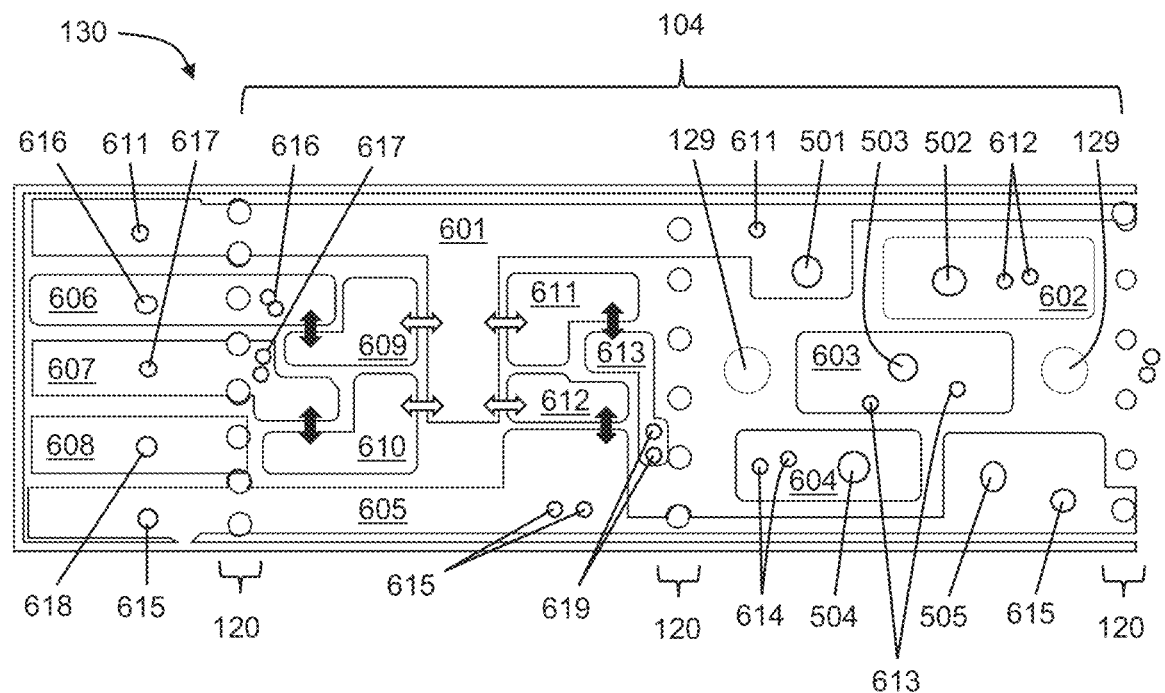
FIG. 5B shows a first conductor layer of the PCB of FIG. 5A.
Figure 5C:
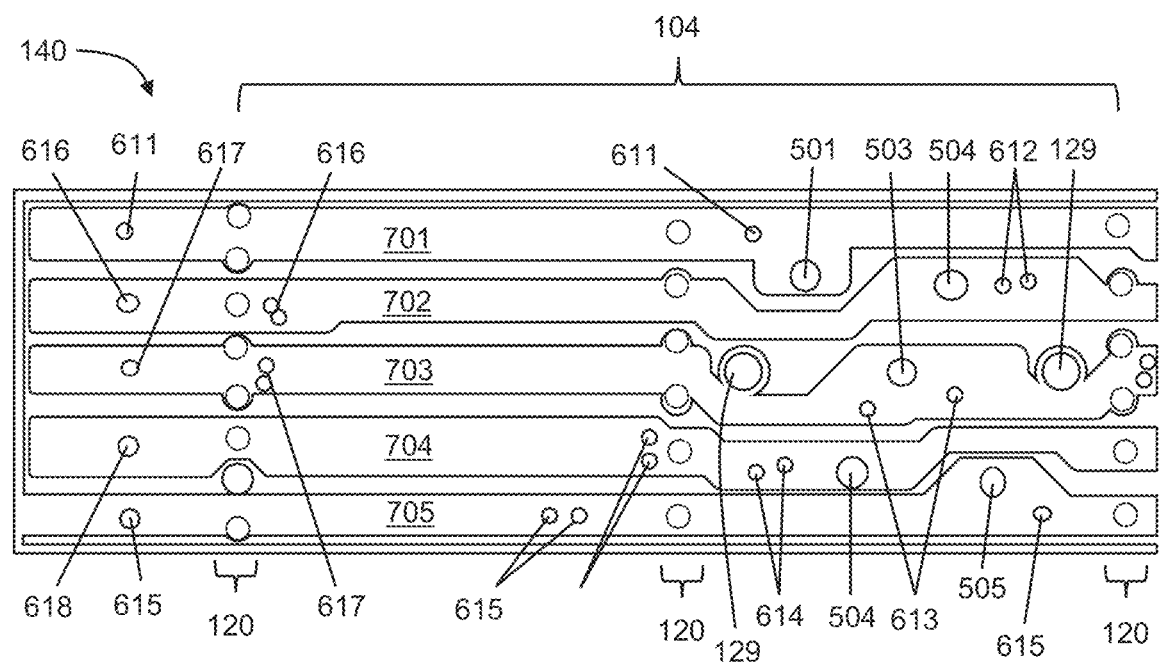
FIG. 5C shows a second conductor layer of the PCB of FIG. 5A.

FIGS. 5A-5C schematically show the configuration for a four-color PCB 100. FIG. 5A shows another outer component layer 102 of the four-color PCB 100. FIG. 5B shows the first conductor layer 130, which is arranged under the outer component surface layer 102 of FIG. 5A. FIG. 5C shows a second conductive layer 140 thereof, which is arranged under the first layer 130 and separated therefrom by insulating material. The PCB configuration pattern repeats in sections 104 at intervals. The circuity design and electrical operation of this four-color PCB 100 is substantially the same as the single-color PCBs discussed above (see FIGS. 3A-4B) and two-color PCB discussed below. Accordingly, the above descriptions for like elements apply here; however new reference numerals are used for certain elements for the purposes of clarity and description here given the additional components. In this example, the four colors are red, blue, green and white (RBGW) in the visible spectrum, offered by way of example and not limitation. Other colors or light frequencies of the installed LEEs may include, e.g., infrared (IR) for therapeutic heating, ultraviolet (UV) for sterilization, or colors optimized for plant or mushroom cultivation, just to name a few. The conductor geometry is slightly more complex to accommodate the four control signals and one common, typically operating at 12-24V commonly used in current art power supplies. As before, periodic perforations 120 are placed at intervals to allow adjustment of the PCB length without tools. Additionally, the device may be cut at virtually any location while maintaining illumination to remaining LEEs via conductor path redundancy. The locating or indexing holes 129 again mate with pins of the rail clip 200. Conductive screws are installed into holes 501-505 piercing respective wires 60, completing electrical connections to respective termination pads 506-510, which are provided by respective conductor traces 601-605 in the first conductive layer 130, and thus also to respective solder pads 511-515 due to the mesh network. One of the terminals of the four LEEs 150 are respectively connected to pads 516-519, which are provided by common conductor trace 601 in the first conductive layer 130. The other terminals of the LEEs 150 connect to solder pads 520-523 respectively. A first limiting resistor 160 has its first terminal connected to solder pad 524 and its second terminal connected to solder pad 525. A second limiting resistor 160 has its first terminal connected to solder pad 526 and its second terminal connected to solder pad 527. A third limiting resistor 160 has its first terminal connected to solder pad 528 and its second terminal connected to solder pad 529. A fourth limiting resistor 160 has its first terminal connected to solder pad 530 and its second terminal connected to solder pad 531.

Referring now to FIG. 5B, conductors 601 and 605 run the PCB length, such as 24 inches or 0.5 m for example, through repeating sections 104. The conductor trace 601 is connected to pad 506, 511, and 516-519 in FIG. 5A as well as conductor 701 in FIG. 5C with vias 611. The conductor trace 602 is connected to pad 507 in FIG. 5A as well as conductor 702 in FIG. 5C with vias 612. The conductor trace 603 is connected to pad 508 in FIG. 5A as well as conductor 703 in FIG. 5C with vias 613. The conductor trace 604 is connected to pad 509 in FIG. 5A as well as conductor 704 in FIG. 5C with vias 614. The conductor trace 605 is connected to pads 510, 515, and 530 in FIG. 5A as well as conductor 705 in FIG. 5C with vias 615. The conductor trace 606 is connected to pads 512 and 524 in FIG. 5A as well as conductor 702 in FIG. 5C with vias 616. The conductor trace 607 is connected to pads 513 and 526 in FIG. 5A as well as conductor 703 in FIG. 5C with vias 617. The conductor trace 608 is connected to pad 514 in FIG. 5A as well as conductor 704 in FIG. 5C with vias 618. The conductor trace 609 is connected to pads 520 and 525 in FIG. 5A and bridges the connection between the first LEE 150 and the first resistor 160. The conductor trace 610 is connected to pads 521 and 527 in FIG. 5A and bridges the connection between the second LEE 150 and the second resistor 160. The conductor trace 611 is connected to pads 522 and 529 in FIG. 5A and bridges the connection between the third LEE 150 and the third resistor 160. The conductor trace 612 is connected to pads 523 and 531 in FIG. 5A and bridges the connection between the fourth LEE 150 and the fourth resistor 160. The conductor trace 613 is connected to pad 528 in FIG. 5A as well as conductor 704 in FIG. 5C with vias 619. In FIG. 5B, the connection spans of LEE terminals are indicated by white double-sided arrows, and the connection spans of resistor terminals are indicated by black double-sided arrows.

Referring now to the bottom conductor layer 140 in FIG. 5C, the five parallel conductors 701-705 run the length of the PCB and repeat their patterns at intervals indicated by section 104. The vias discussed above with respect to FIG. 5B form redundant connections to the LEEs and solder pads. Redundant wire conductors 601-605 and conductors 701-705 are placed in galvanic communication with multiple vias 611-619. This network provides redundant low impedance paths to the distributed LEEs and power connections. This allows the PCB to be cut at virtually any location without tools while retaining illumination to remaining LEEs. Combined with the retention and termination clips (see FIG. 2), rapid inverted installations are significantly simplified. The four-color design enables many applications.

Figure 6:
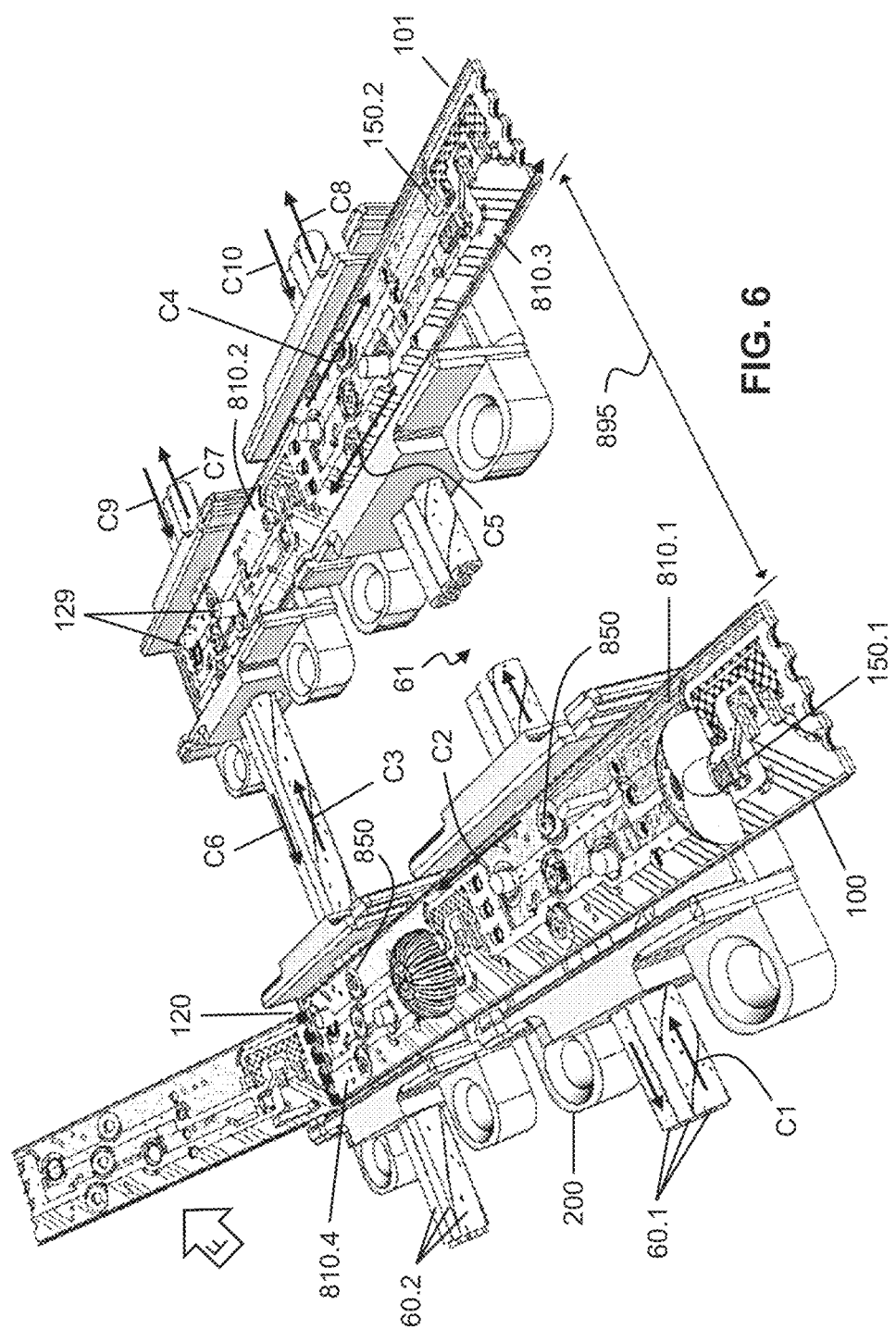
FIG. 6 is a perspective view of a segment of a backlight system with two-color PCBs.

FIG. 6 is a perspective view of a small section of two-color PCBs 100, 101 of a backlight system 10 with rails 250 omitted for clarity. As also discussed in reference to FIGS. 7A and 7B and others, an aspect of the overall circuitry is redundancy of conductors. In the event of incidental damage during installation, or intentional cutting to size in order to accommodate obstacles or reduce the number of PCBs in the array, the redundancy allows the remaining device to maintain illumination. The redundancy of the PCB mesh network provides alternate paths if PCB traces are cut or broken. In the depicted example, the PCB 100 is being trimmed by applying force F about perforation line 120. Another aspect is continued operation in the event of a wire cut as indicated by 61 in FIG. 6. Cut in first wires 60.1 at 61 interrupts current from PCB segment 100 to 101 through first wires 60.1. One of the first wires 60.1 carrying supply current from power source is connected to conductor 810.1 of PCB 100 via conductive screw 850. The conductor 810.1 provides current to components on PCB 100 including LEE 150.1. The process is repeated in electrically connecting the conductor 810.1 to one of the second wires 60.2, and then again to connect this wire to the conductor 810.2 of PCB 101, thereby energizing components on PCB 101 including LEE 150.2. In the same manner, return current from conductor 810.3 of PCB 101 is connected to another one of the second wires 60.2, which likewise connects to conductor 810.4 of PCB 100. The conductor 810.4 is connected to another one of the first wires 60.1 which then returns to power source. This pathway is indicated by current arrows C1-C6. Currents C7-C10 enter and exit to energize additional members of this resilient mesh network. Note additional levels of redundancy and lower system impedance having power sourced in parallel. The design has a lower net system impedance than certain prior art due to redundant conductor paths, which translates directly to minimal undesirable brightness variations. This feature allows a user to cut at any location or simply break at periodic perforations without tools, simplifying installation. By way of example, and not limitation, two-color PCBs 100 and 101 are shown, however as described above single-color and four-color PCBs also support these features. The electrical configuration of the two-color PCBs is further discussed with reference to FIGS. 7A and 7B.

Figure 7A:
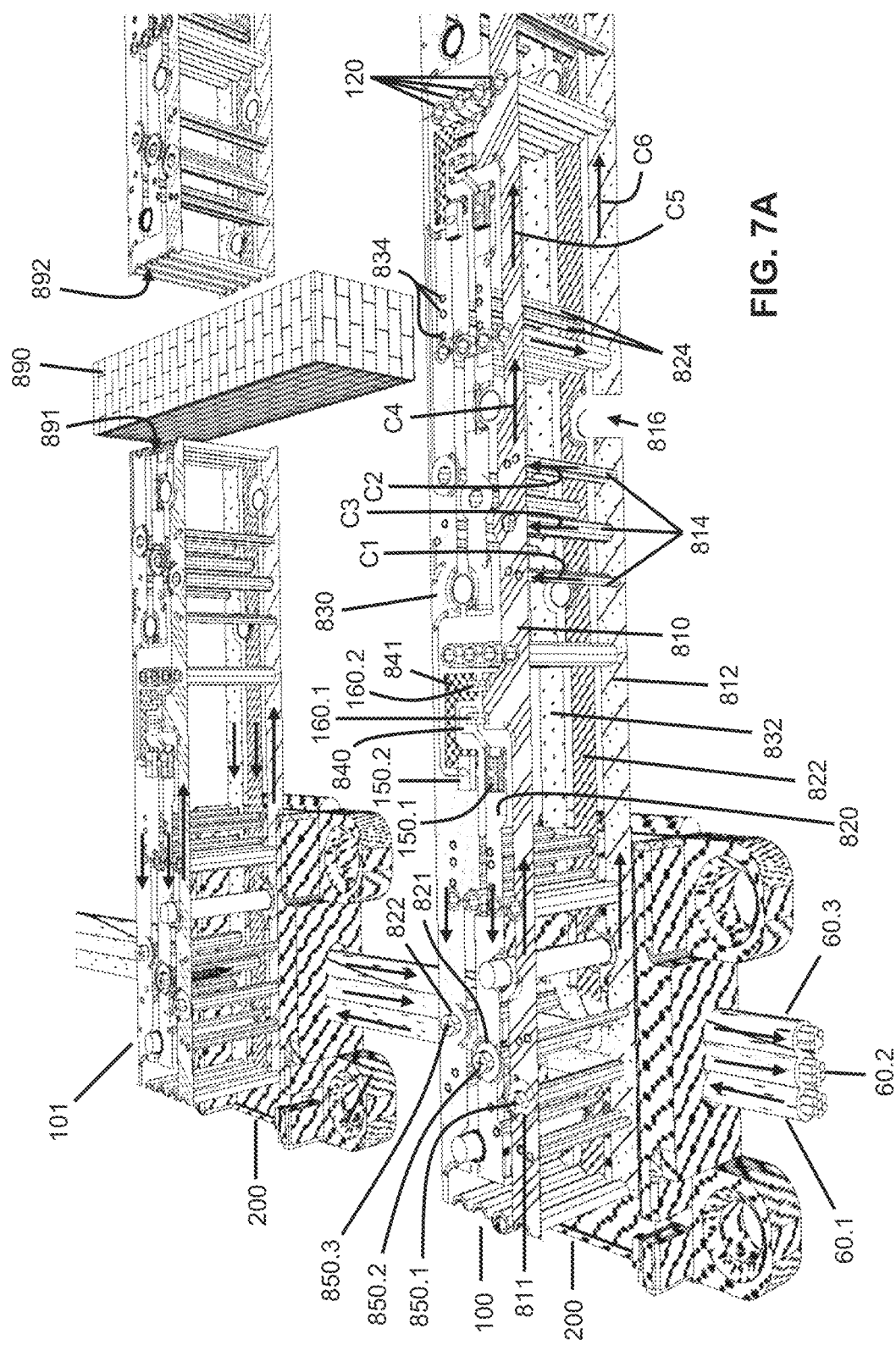
FIG. 7A is a partially exploded, left half perspective view of a section of an example two-color PCB embodiment.
Figure 7B:
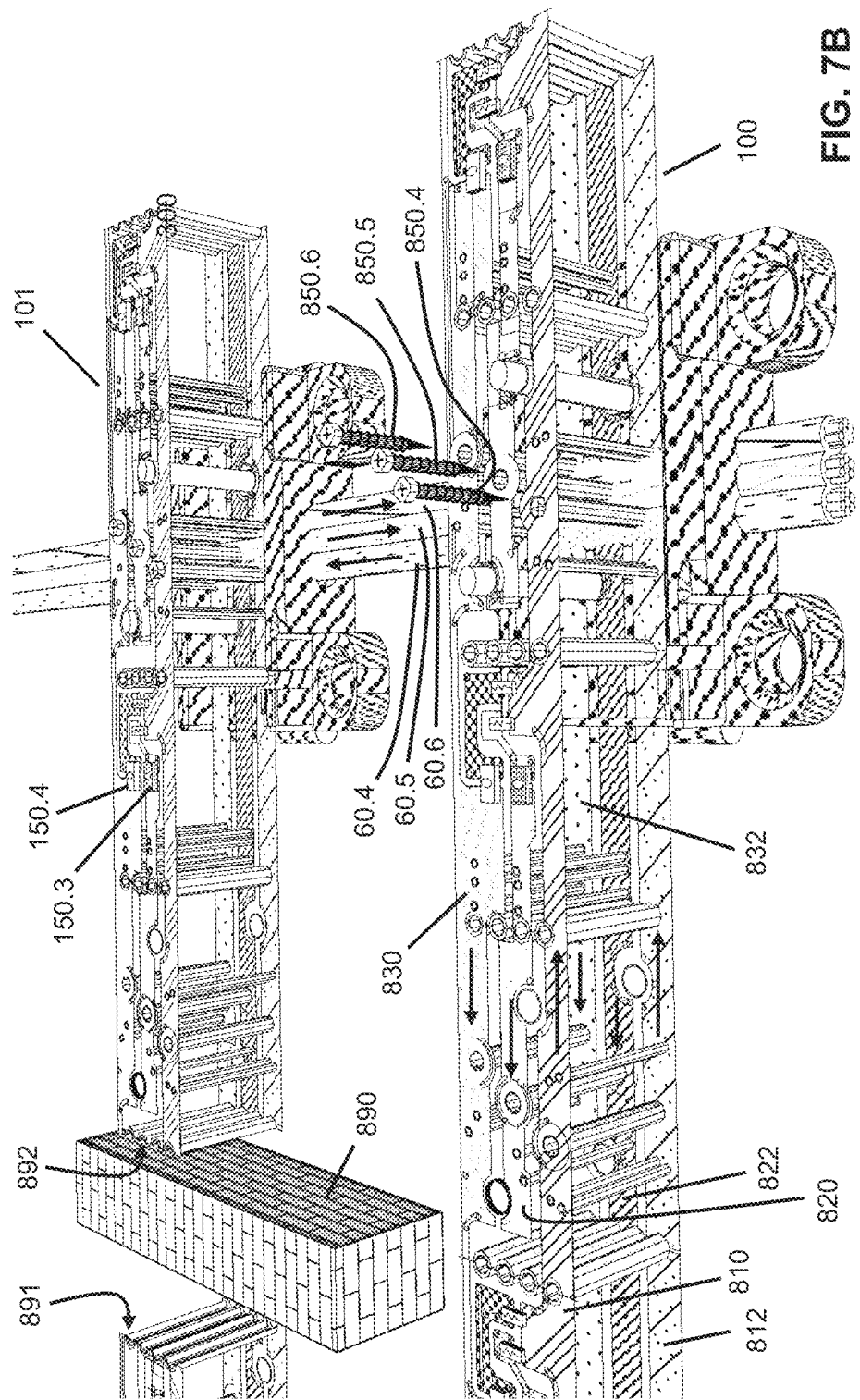
FIG. 7B is a partially exploded, right half perspective view of a section of an example two-color PCB embodiment.

FIGS. 7A and 7B show a two-color PCB assembly similar to FIG. 6, with insulating matrix and rails removed for clarity. The assembly comprises two-color PCBs 100 and 101. The top and bottom conductor layers of the two PCBs 100, 101 are shown in an exploded view with exaggerated interconnecting vias, indexing pins and perforation holes (depicted as tall tube-like members). Therefore, these figures are not to scale. The system forms a redundant three-dimensional mesh network. The principle of operation is the same for PCBs with one color (see FIGS. 3A-4B), two color as here, or four color (see FIGS. 5A-5C) LEEs, or any other number.

Referring first to PCB 100 in FIG. 7A, external power is applied to multi-stranded wire 60.1, which is transected by conductive screw 850.1, forming galvanic connection to pad 811 which communicates with upper conductor 810. This is the same for wires 60.2 and 60.3, conductive screws 850.2 and 850.3, pads 821 and 831, and upper conductors 820 and 830 respectively. The screw termination is offered by way of example and not limitation, as connections may also be formed by welding, soldering, and insulation displacement to name a few. Pad 811 is part of conductor 810 which is in communication with the first terminals of current limiting resistors 160.1 and 160.2. The second terminal of resistor 160.1 is in communication with conductor 840 which connects to the first terminal of LEE 150.1. The second terminal of LEE 150.1 is in communications with conductor 820, pad 821 and screw 850.2. Screw 850.2 is in communications with wire conductor 60.2 completing the circuit. The second terminal of resistor 160.2 is in communication with conductor 841 which connects to the first terminal of LEE 150.2. The second terminal of LEE 150.2 is in communications with conductor 830, pad 831 and screw 850.3. Screw 850.3 is in communications with wire conductor 60.3 completing the circuit. The lower conductor layer includes conductors 812, 822, and 832, which are connected to upper conductors 810, 820, and 830 respectively with vias 814, 824 and 834 respectively. The wire conductors 60.1, 60.2 and 60.3 continue from PCB 100 to PCB 101, with the component configuration and circuitry of PCB 101 being the same as PCB 100. Thus, the above descriptions regarding the PCB 100 apply equally to PCB 101, and therefore are not repeated here with respect to PCB 101 or correspondingly labeled in the figures for PCB 101.

Often during installation, PCB members must be trimmed to avoid environmental obstacles such as obstacle 890. A series of pre-drilled perforations 120 facilitates trimming without tools by simply folding along such periodic break lines provided thereby. As the PCB is generally less than 2.5 mm thick, it may also be cut at any other locations with common tools, such as scissors, if needed. The array 50 can therefore be customized without creating a short and maintaining illumination. As described above with respect to PCB 100, the upper layer conductors 810, 820, 830 are respectively connected to lower layer conductors 812, 822, 832 with vias 814, 824, 834. This configuration lowers the resistance by adding a second conductor in parallel while adding redundancy. For example, if installers inadvertently cut conductor 812 at location 816, there are still alternate via paths for current as indicated by arrows C1, C2 and C3. Current C4 bypasses the cut 816 to deliver current C5 and C6 to the additional LEEs on PCB 100 in FIG. 7B. The process would be the same for a single or plurality of component layer cuts.

FIG. 7B is the second half of FIG. 7A showing connection redundancy. A user can trim PCB 101 at 891 and 892 to bypass obstacle barrier 890 while still maintaining illumination to LEEs 150.3 and 150.4. As PCB section 100 continues from FIG. 7A to FIG. 7B, currents C5 and C6 through conductors 810, 812 from source 60.1 are connected to wire 60.4 via screw 850.4. The process is the same for conductors 820, 822 and 830, 832 with wires 60.5 and 60.6 via screws 850.5 and 850.6 respectively. The process repeats for wires 60.4-60.5 connecting to conductors of PCB 101 and thus completing the circuit to power LEEs 150.3 and 150.4. Thus, both segments of PCB 101 maintain illumination in spite of being completely cut at 891 and 892 to accommodate the obstacle 890. It should be noted that additional PCBs are typically attached in parallel to PCBs 100 and 101 using wires 60.1-60.6 to form an array 50 as shown in FIG. 1A, and such additional PCBs may be physically adjusted in the same or any number of different ways.

By way of example and not limitation, etched copper conductors are used in this embodiment. Of course, other conductor configurations may be used. Higher voltage operation proportionally reduces current and voltage drops, thus permitting fabrication of directly screen-printed conductors on low-cost flexible and ridged substrates. Operation at lower currents substantially improves large area lighting uniformity due to less voltage drop for the same copper used. Redundant current paths as disclosed herein provide lower impedance and thus less voltage drop, avoiding undesirable non-uniform illumination.

Figure 8:
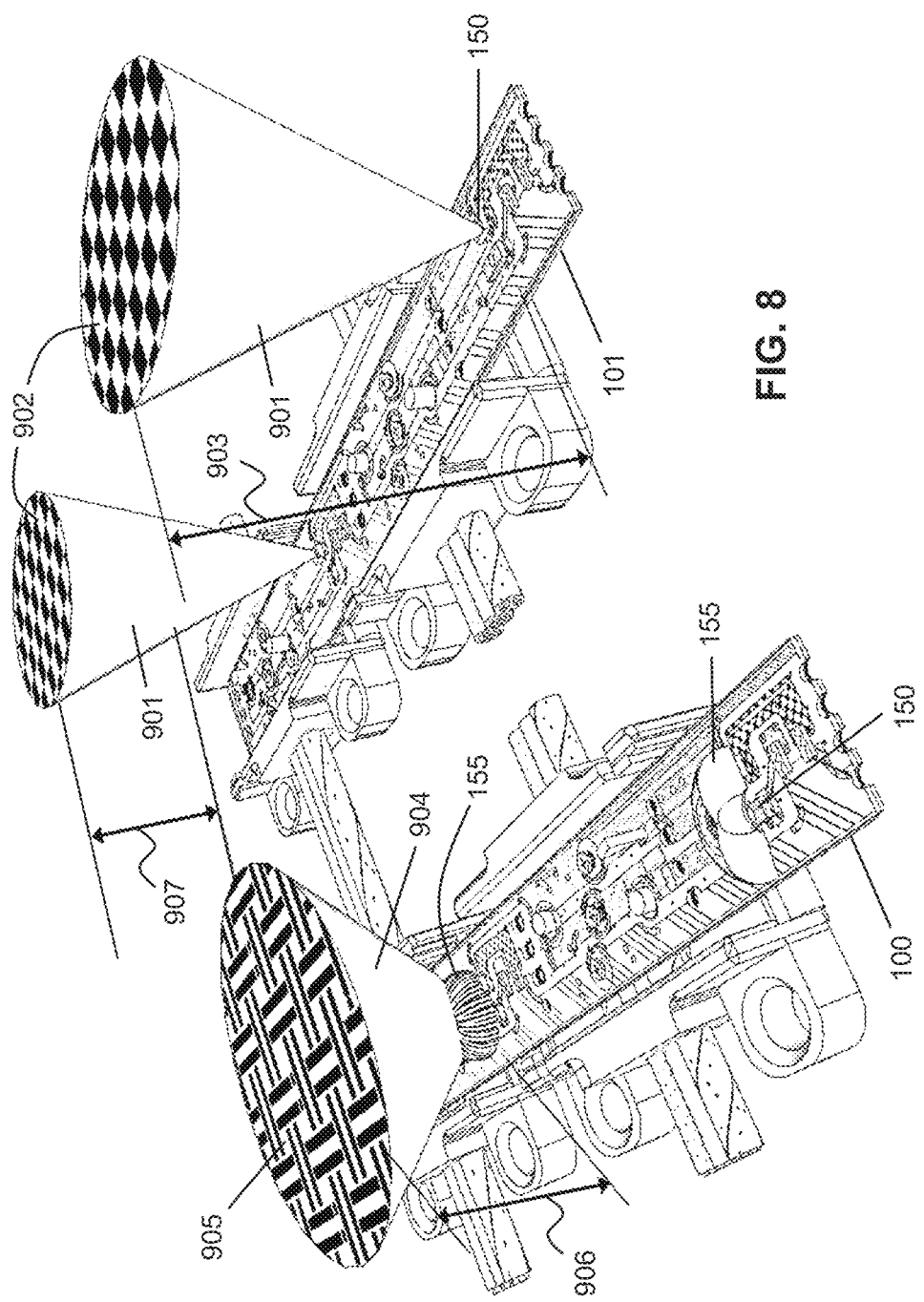
FIG. 8 shows the arrangement of FIG. 6 with LEE light cones.

FIG. 8 shows light cones for the arrangement of FIG. 6. The PCB 100 has lenses 155 affixed to its LEEs 150 for the purpose of enhancing light uniformity. LEDs often have square or rectangular emitting geometries producing a narrow, elliptical-shaped light cone angle 901 (see PCB 101). This is observed on a closely spaced diffusing surface as an undesirable bright spot 902. To minimize this artifact of the LED source 150, a larger distance 903 to the diffuser surface must be used. The addition of lens 155 increases the width of the solid cone angle 904 and produces a larger, more circular illumination spot 905, which proportionally reduces the distance 906 to the diffusing surface required to minimize the negative effects of a non-circular emitter 150 in this context. A cutaway view of lens 155 is taught in FIG. 9 which corresponds to the view of the first LEE 150 on the PCB 100. The corresponding reduction in distance to a diffuser 907 directly reduces the cost, size and weight of final assemblies, as well as increased the overall versatility of the system. Accordingly, the use of optional but preferred diffuser lenses performs at least three important functions:

produces a more circular illumination; significantly reduces the space to the diffuser; and reduces or eliminates the issue of "hot spots."

Figure 9:
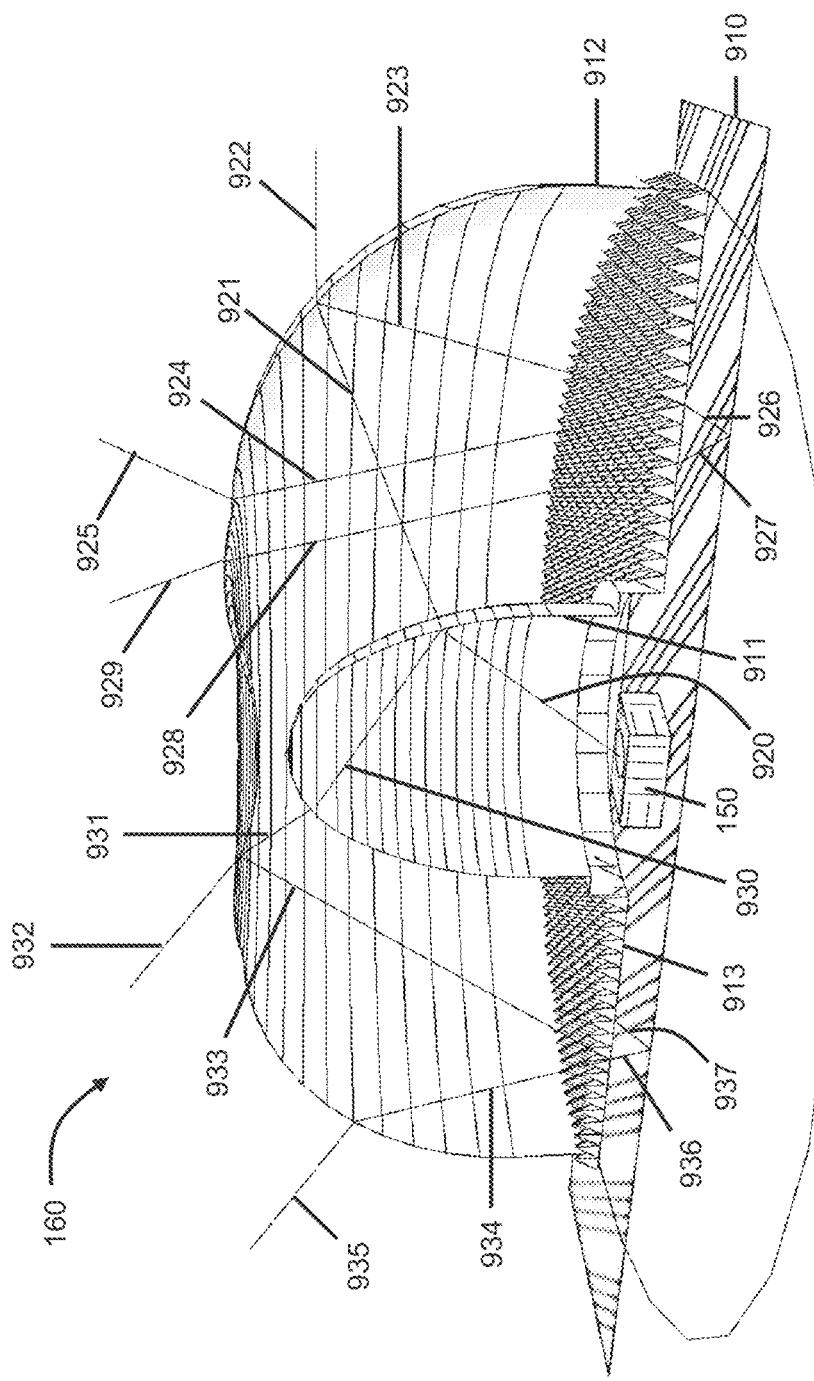
FIG. 9 is a cutaway view of a diffuser lens assembly as seen in FIG. 8.

FIG. 9 is a perspective cutaway view of LEE 150 with lens diffuser 155. This configuration can be used to replace a thick, bulky diffuser located at great distance 903 (see FIG. 8) from the LEE source 150, to avoid what is known in the trade as "hot spots", or undesirable areas of greater relative brightness. The requirement for greater spacing between the light source and diffuser translates to a less desirable and larger light source assembly. In the depicted embodiment, by way of example and not limitation, lens 155 is affixed to white substrate 910 and centered over LEE 150. By way of example and not limitation, this lens 155 is made from polycarbonate with an index of refraction in the range of 1.50-1.65. Of course, other materials and indices may also be selected. The lens design comprises an inner surface 911 and an outer surface 912 mounted over a micro-pyramidal array 913. The micro-pyramidal array 913 provides a low-loss, optically-rough, mirror-like surface, thus reflecting and scattering light over a large range of angles.

In FIG. 9, the reference numeral lead lines are provided darker and thicker than light rays. Ray 920 originating from LEE 150 impinges on air to higher-index surface 911 and is diffracted according to Snell's law, which is well known in the art. Diffracted ray 921 continues to high-index to air interface 912, where it is refracted to provide illumination as ray 922, while some portion is internally reflected as depicted by ray 923. A portion of ray 923 incident on the micro-pyramidal array 913 is reflected as ray 924. Reflected ray 924 impinges on high index to air surface 912 and is refracted as visible ray 925. A portion of ray 923 is transmitted as ray 926 and reflects off reflective surface 910 as ray 927. Reflected ray 927 is refracted at the array 913 as ray 928 and again refracted at interface surface 912 to provide illumination as ray 929. Similarly, a portion of ray 920 is reflected by surface 911 as ray 930, governed by incident angle and impedance or index of refraction difference. Ray 930 is refracted at interface 911 into ray 931. A portion of ray 931 exits surface 909 to provide illumination as ray 932, while the balance is internally reflected as ray 933. A portion of ray 933 is reflected by the micro-pyramidal array 913 as ray 934, which is refracted at surface 909 as illumination ray 935. Light transmitted through array 913 as ray 936 is reflected as ray 937 by white substrate surface 910 below. Without the need to further describe ray divergence between reflections and refractions at surfaces 910, 911, 912 and 913, it quickly becomes apparent that this geometry is very effective at scattering or diffusing light from a point like LEE source over large angles.

The rotated parabolic surface 911 with curved volume effectively flattens the radiation angle from the LEE 150. For example, a narrow angle of 60 degrees measured at ½ power or 3 decibels can be widened to approximately 170 degrees with this design. The addition of the array of micro-pyramidal structures 913 provides additional scattering, further making common rectangular-shaped emitters appear more circular (see 905 in FIG. 8). Such lens geometry fabricated from a high-index material is compact and reduces the 'hot spot' issue, while making the final assembly smaller, lower cost, and brighter.

Figure 12A:
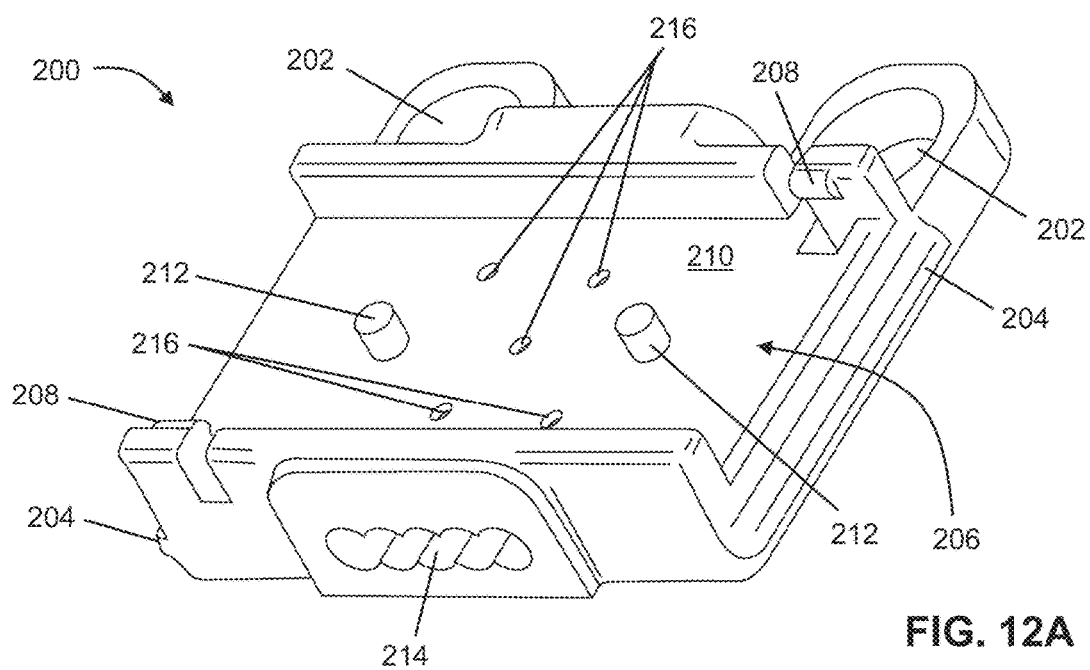
FIG. 12A is a top perspective view of a rail clip for the multicolor (RGBW) PCB.
Figure 12B:
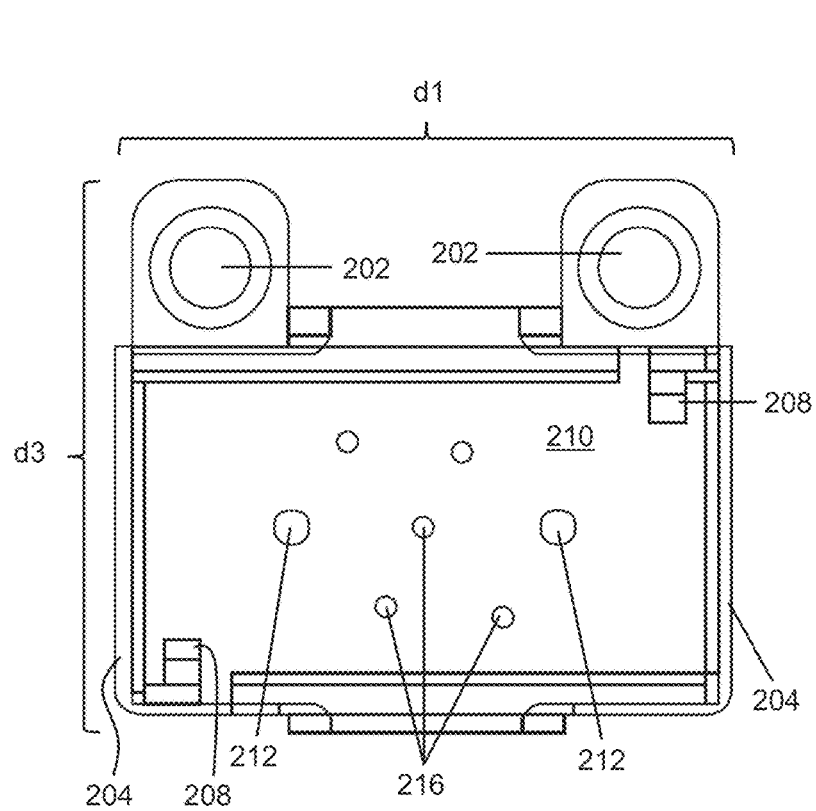
FIG. 12B is a top plan view thereof.
Figure 12C:
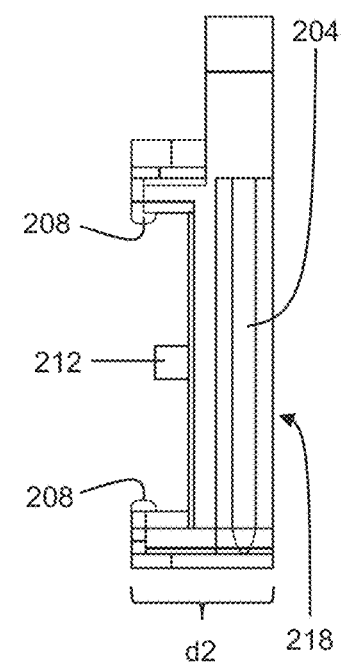
FIG. 12C is a side elevation view thereof.

The PCB adapter clip 200 mounts the PCB 100. FIGS. 10A-10C show a clip 200 adapted for the PCB of FIGS. 3A-3C. FIGS. 11A-11C show a clip 200 adapted for the PCB of FIGS. 4A-4B. FIGS. 12A-12C show a clip 200 adapted for the PCB of FIGS. 5A-5C. FIGS. 13A-13C show a clip 200 adapted for the PCB of FIGS. 7A-7B. The following descriptions apply equally for each of these clips 200 and therefore are not repeated separately. Mounting holes 202 on flanges are provided to allow the clip 200 to be attached directly to a flat surface, such as a walls and apparatuses that require back lighting, without the rail system if desired. For example, screws, nails or other fasteners inserted through holes 202, or adhesives, could be used to attach the clip 200 to the surface depending on the nature of the surface. Ridges 204 extend along at least a portion of the sides of the mounting clip 200 to allow the clip 200 to snap into complimentary channels of rail 250 (see FIGS. 14A-14B) and be retained therein. The PCB 100 sits in channel 206 and is held in place there in a snap fit manner by retention clips 208 formed on either side of the channel walls. Index or mounting pins 212 extend from the channel surface 210. The pins 212 align with and insert into the mounting holes 129 which extend through the respective PCB 100 (see FIGS. 3A-3C, 4A-4B, 5A-5C and 6). Wire conduits or holes 214 traverse the body of clip 200 to allow power and return wires 60 to be run through the mounting clip 200. Holes 216 extend from the bottom surface 218 to channel surface 210. A conductive screw or other fastener 850 (see e.g. FIG. 6) is fed through each of the connection holes in the PCB 100 (see e.g. holes 114 and 116 in FIGS. 3A-3C and 4A-4B, holes 501-505 in FIGS. 5A-5C) to create an electrical connection between the PCB traces and wires 60 as described above. For example in FIG. 7A, the screws 850.1, 850.2 and 850.3 pierce the wires 60.1, 60.2 and 60.3 respectively to connect with the power supply. This creates galvanic connection from the PCB 100 to the power supply. The PCB adapter clips 200 permit rapid installation and/or exchange of lighting configurations using the same rail system without tools. The clip-rail system facilitates safe overhead installation of large-area illumination apparatuses. Nominal dimensions include: d1=31.5 mm (all clips 200 have same width for mating with common rail); d2=7.3 mm (all clips 200 have same height here which is configured so that the PCBs just clear the sides of the common rail); d3=24 mm for the narrower PCBs (clips 200 of FIGS. 10A-10C and 12A-12C) or d3=28.5 mm to provide a wider channel 206 to accommodate the wider PCBs (clips 200 of FIGS. 11A-11C and 13A-13C).

Figure 14A:
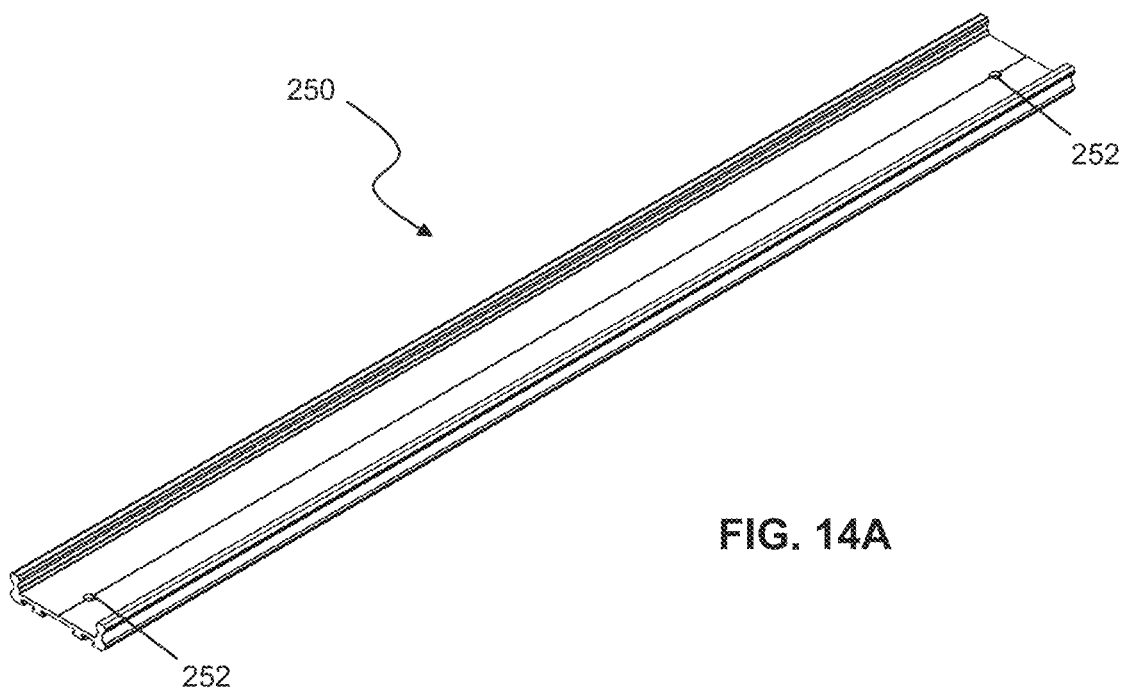
FIG. 14A is a top perspective view of an example rail.
Figure 14B:
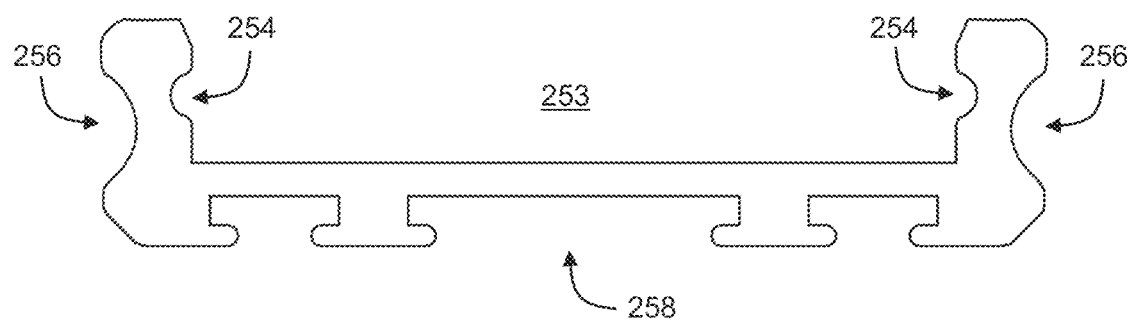
FIG. 14B is an end side elevation view thereof.

FIGS. 14A and 14B show an example rail 250 of the mounting system. Snap holes 252 are described below with respect to counterparts. The longitudinal channel 253 for PCB clips 200 has a generally U-shaped cross section. The inner sides of channel 253 have slots or channels 254 which receive the protrusions 204 of the adapter clips 200 in a snap-fit manner. The clip 200 and the rail 250 are preferably sized so that the rail 250 securely captures the clip 200 when coupled together, such that the attachment supports the clip 200 and components carried by the clip 200 in an overhead mounting surface arrangement as well as retains the position of same in a vertical mounting surface arrangement, while also providing enough tolerance to allow the user to slide mounted clip 200 along the rail 250 into different positions as needed. The channels 254 and complimentary protrusions 204 may have different coupling geometries than in the depicted embodiment. The outer sides of the rail 250 also comprise channels 256 which are described below with respect to counterparts. The bottom side 258 of rail 250 has protrusions and channels shaped to interface with the rail end clips 350 and rail-to-rail clips 400 as discussed below.

Figure 15A:
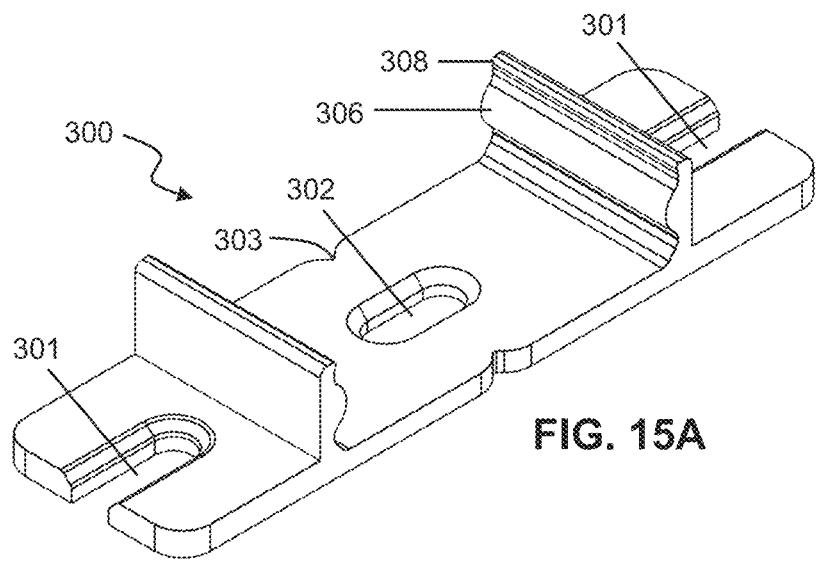
FIG. 15A is a top perspective view of an example surface-to-rail mounting clip.
Figure 15B:
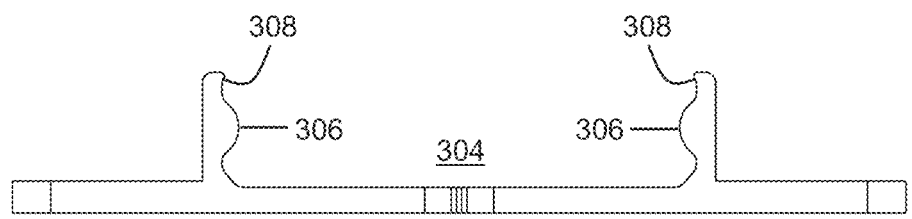
FIG. 15B is a front side elevation view thereof.

FIGS. 15A and 15B show an example rail-to-surface mounting clip 300. The rail mounting clip 300 allows the rails 250 to be mounted to a mounting surface, such as a wall or ceiling (see FIG. 2). The base of the mounting clip 300 has slots 301 on flanges to mount the clip 300 to the surface with fasteners. The middle hole 302 may also be used for this purpose, and additionally provides a central aperture to the surface for laser guided installations. In this regard, visual indicator 303 assists the user in locating the center point and properly aligning the clip 300 prior to fastening to the surface. In this example, the indicator 303 is provided as a notch or groove, but numerous other design alternatives are possible in this regard. The rail channel 304 of the clip 300 has a generally U-shaped cross section. The inner sides of channel 304 have inward-extending ridges or protrusions 306 which interface with the channels 256 of rail 250 in a snap-fit manner. Hook-like extensions 308 at the edge further act as flexible springs to positively captures the rail 250. As with the adapter clip 200 and rail 250, the clip 300 and rail 250 are preferably sized so that the clip 300 securely retains the rail 250 when coupled together, such that the attachment supports the rail 250 and components carried by the rail 250 in an overhead arrangement, while also providing enough tolerance to allow the user to slide the rail 250 along the clip 300 into different positions as needed. A single installer is able to spatially position and affix the lightweight clips 300 with common hand tools. Rails 250 then simply snap or slide into clips 300, and rail extenders 400 (see FIG. 23) may be added as needed, all done with no tools. Once the clips 300 with rails 250 are installed to the surface, one or more rolls of PCBs 100, such as the LEE array 50, with appropriately sized adapter clips 200 are simply snapped into rails 250 and connected to power supply. This makes difficult ceiling applications simpler and safer.

Figure 16:
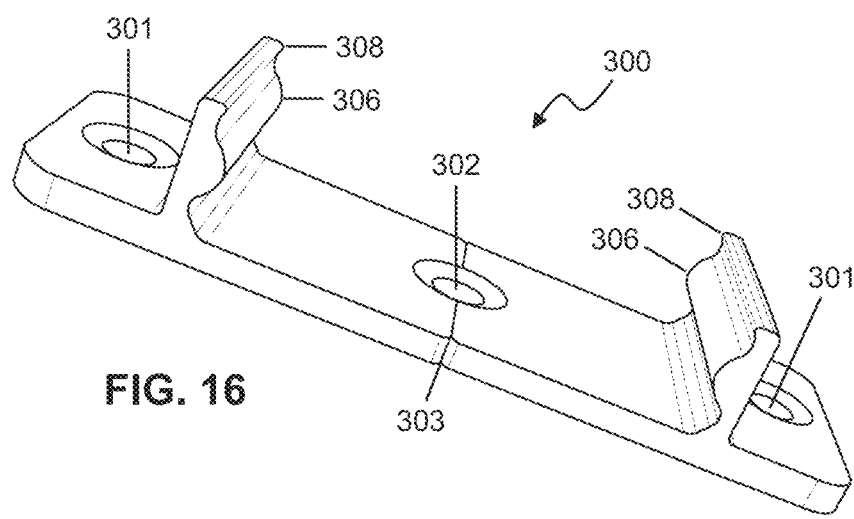
FIG. 16 is a top perspective view of an alternate surface-to-rail mounting clip.

FIG. 16 shows another example rail-to-surface mounting clip 300 with round fastener holes 301 and 302 instead of slots. The alignment guide indicator 300 further includes a centerline extending from the notches to the hole 302. The clip 300 is otherwise the same in design as the clip 300 of FIGS. 15A and 15B; the above descriptions apply equally here.

Figure 17A:
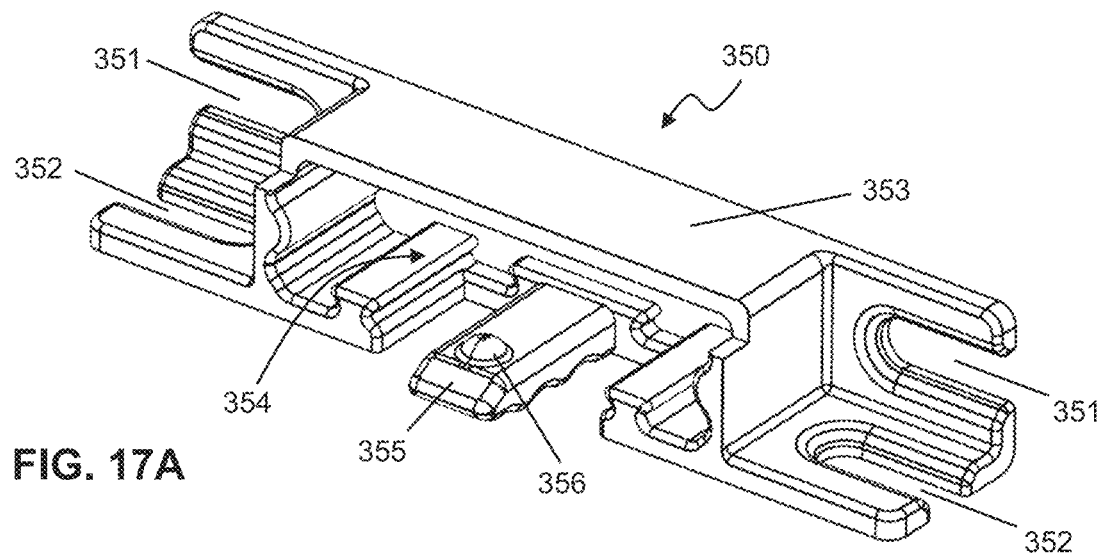
FIG. 17A is a top perspective view of an example rail end mounting clip.
Figure 17B:
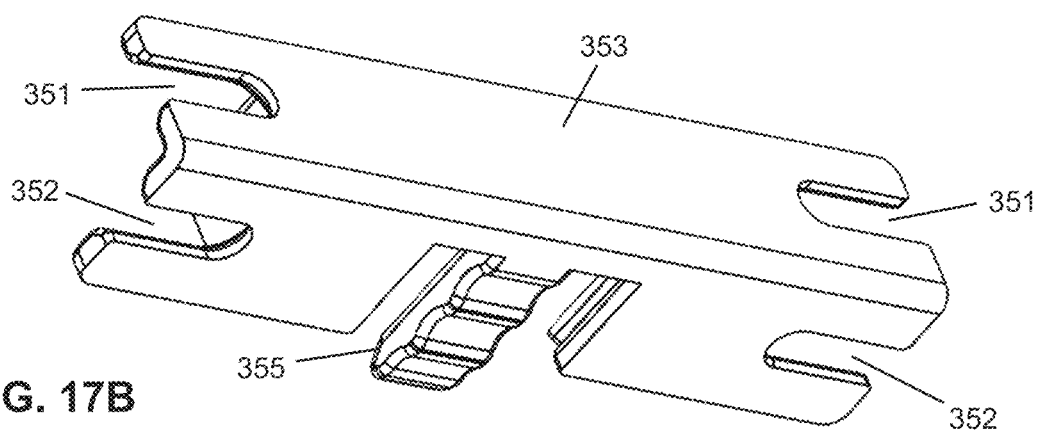
FIG. 17B is a bottom perspective view thereof from the other side.

FIGS. 17A and 17B show an example rail end mounting clip 350 that connects to the end of the rail 250. A problem that occurs in vertical installations is where the rails 250 are free to slide downward in the rail-to-surface mounting clips 300 out of the desired positioning. The rail end mounting clip 350 positively captures the rail 250 with respect to the vertical direction and avoids this problem. Slots 351, 352 on flanges are fastener slots that allow the retaining clip 350 to be mounted to one or more surfaces. The flanges are angled at approximately 90° to accommodate perpendicular and/or parallel mounting. For example, one or both fastener slots 351 and 352 may be used at the juncture between a wall and ceiling or the juncture between a wall and floor. The body 353 of the clip 350 forms a cap for the end of the rail 250. The cavity 354 of the cap 353 is complimentarily shaped to the cross-sectional geometry of the rail 250 (see FIG. 14B). Arm member 355 within the cavity 354 carries a protrusion 356. The protrusion 356 is designed to insert into end holes 252 of the rail 250 in a snap-in manner. The arm member 355 acts as a flexible spring in accommodating the displacement of the protrusion 356 along the bottom 258 of the rail 250 before the protrusion 356 snaps into a rail hole 252.

Figure 18:
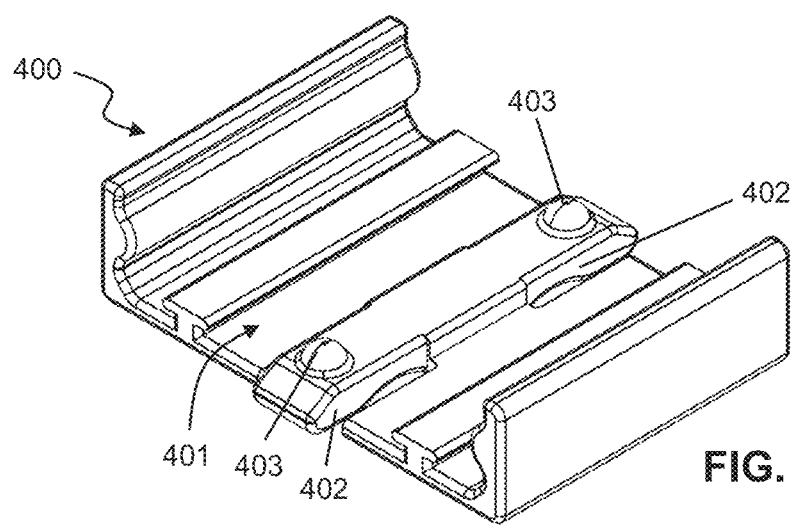
FIG. 18 is a top perspective view of an example rail-to-rail connector clip.

FIG. 18 shows a rail-to-rail clip 400 which attaches the end of one rail 250 to the end of another rail 250. As mentioned above, the rails 250 are preferably the same length as the PCBs 100 for shipping purposes, such as for example 24 inches. Of course, the rails 250 may also be shorter or longer than the PCBs 100. When a particular installation requires a rail system which is longer than the length of an individual rail 250, the rail connector clip 400 can be used to connect multiple rails 250 together in line. Like rail end clip 350, the rail channel 401 of the rail connector clip 400 is shaped to match the exterior geometry of the rails 250, including the T-shaped channels and projections on the bottom side 258 to provide an interlocking joint connection therewith. The bottom of channel 401 comprises two arm members 402 which extend in opposite directions along the rail longitudinal axis. The arm members 402 each have a protrusion 402. As before, the protrusions 403 are designed to insert into the end holes 252 of the adjoining rails 250 in a snap-in manner. The arm members 402 act as flexible springs in accommodating the displacement of the protrusions 403 along the bottom 258 of the rails 250 before the protrusions 403 snap into the rail holes 252.

Figure 19:
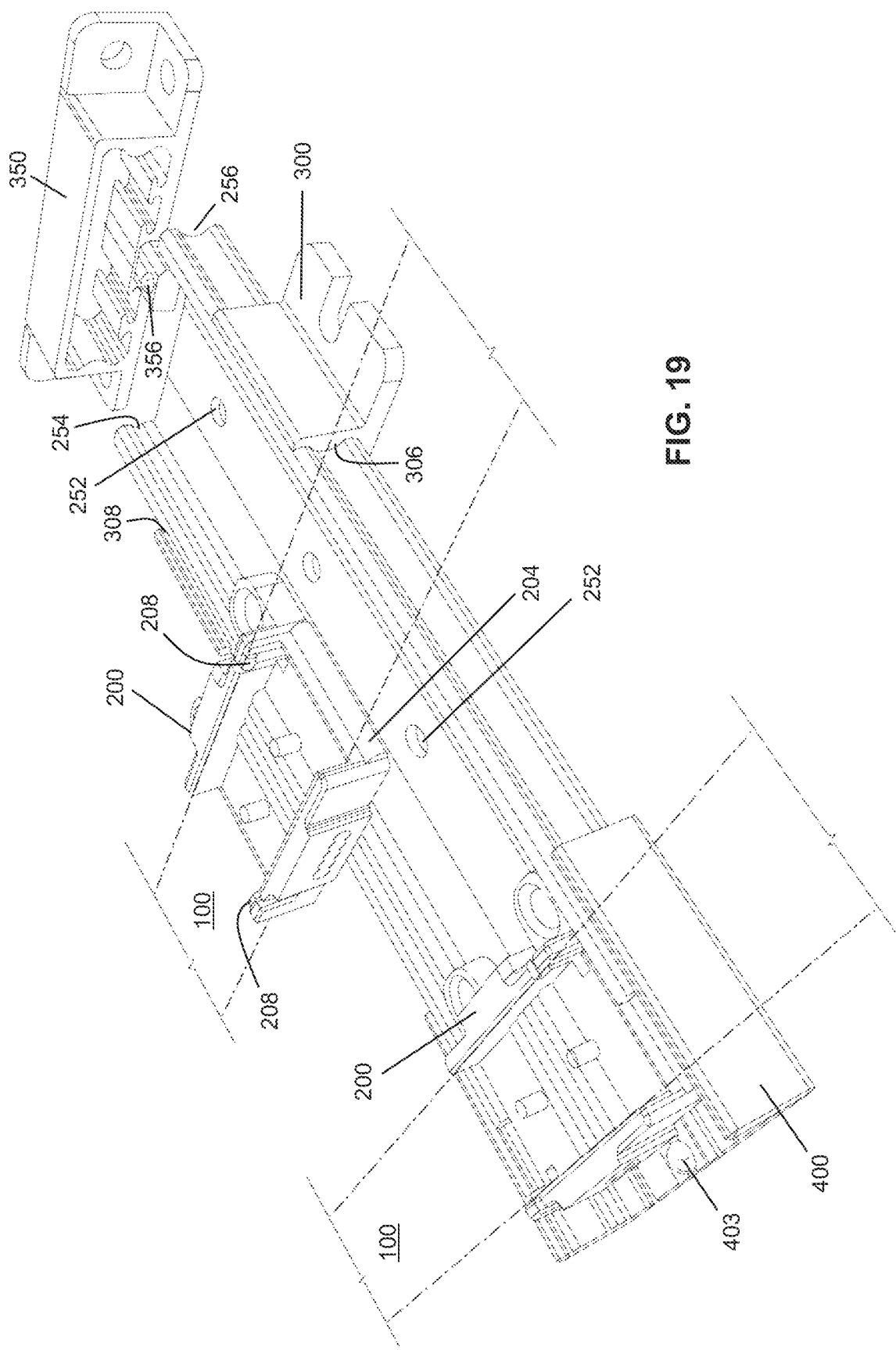
FIG. 19 is partially exploded, top perspective view of a rail assembly system.

FIG. 19 shows an end section of the rail mounting system. The rail-to-surface mounting clip 300 will be fastened to a surface, such as a wall or ceiling, with fasteners (not shown). The rail 250 is snapped into the clip 300 as described above, wherein the external channels 256 of rail 250 receive the complimentary protrusions 306 of clip 300 and the extensions 308 of clip 300 hook onto the edge of the rail 250. The adapter clips 200 carry parallel PCBs 100 which are schematically represented by dot-dash lines. Wires 60 connecting the clips 100. The PCBs 100 are secured in the clips 200 by the retention tabs 208. The adapter clip 200 on the left is installed on the rail 250, wherein the projections 204 of the clip 200 snap into the internal channels 254 of the rail 250 (see uninstalled adapter clip 200 on the right for reference). For vertical installations in particular, the rail end clip 350 will be coupled to an end of the rail 250, such that the protrusion 356 of the end clip 350 snaps into the end hole 252 of the rail 250. Rather than being positioned within the cavity 354, the arm member 355 carrying the protrusion 356 extends from the body 353 of the clip 350 in this example. The functionality is otherwise the same as the example clip 250 of FIGS. 17A and 17B. The rail connector clip 400 is attached to the opposite end of the rail 250, wherein one protrusion 403 of clip 400 has snapped into the last hole 252 of rail 250 on this end (see free side of clip 400 on the left for reference). A second rail may then be attached in line with this first rail 250. In this example, the rail 250 has multiple holes 252 along its length, which allows the rail 250 to be trimmed to different lengths as needed while still maintaining the snap-in functionality with end clips 350 and/or connector clips 400. It should be noted that the length of the rail 250 is not necessarily to scale here; preferably the length of the rail 250 is the same as the length of the PCBs 100, which are shown truncated from a typical uncut length in this figure.

Accordingly, a single installer aided with a laser line tool can quickly and accurately affix the lightweight clips to walls and ceilings. Sections of rail pieces 250 are snapped into surface mounting clips 300. Rails 250 can be extended using connector clip 400. In a vertical installation, rails 250 can be prevented from sliding by end clip 350. With the rail system in place, one person can without tools quickly unroll an array 50 of multiple PCB light bars 100, snap each of the PCB sections 100 via preassembled clips 200 into the rails 250, and adjust the positioning thereof as needed. This system provides for a simple and safe installation. This is particularly true with difficult overhead applications, as well as curved surfaces given the small size of mounting clips and HVAC ducting given the versatility of the system. In one application, for example, the LEE system may have UV lights and be installed inside an HVAC duct to sterilize the air. Demanding illumination applications, such as art or tradeshow exhibits, requiring rapid setup and/or reconfiguration are particularly suited for this system. Complex mounting surfaces with different geometries and/or obstacles (e.g. protruding plumbing) are likewise well suited for the system due to the customizability provided by redundant circuitry described above.

Figure 20:
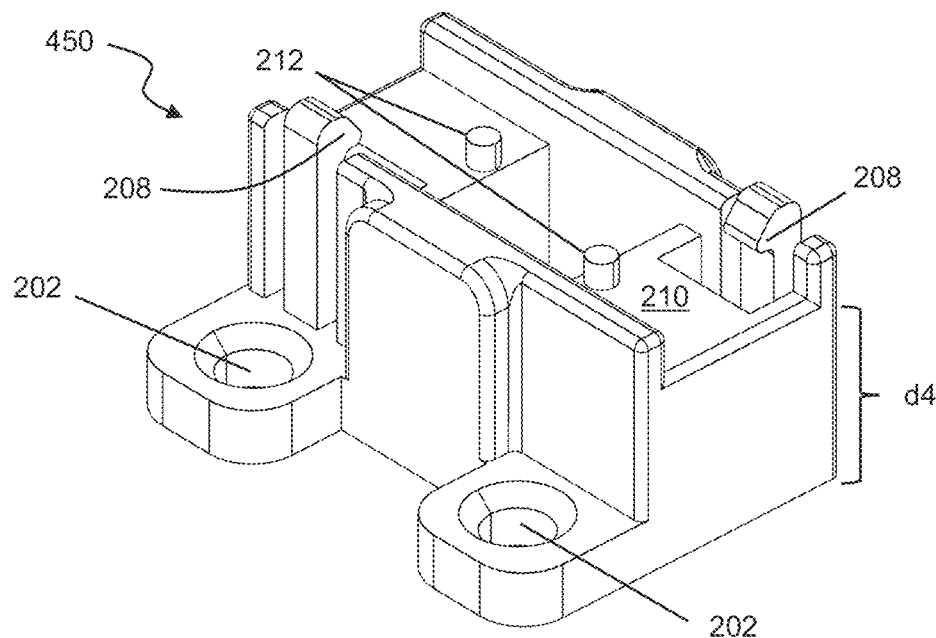
FIG. 20 is a top perspective view of an example PCB-to-surface mounting clip.
Figure 21:
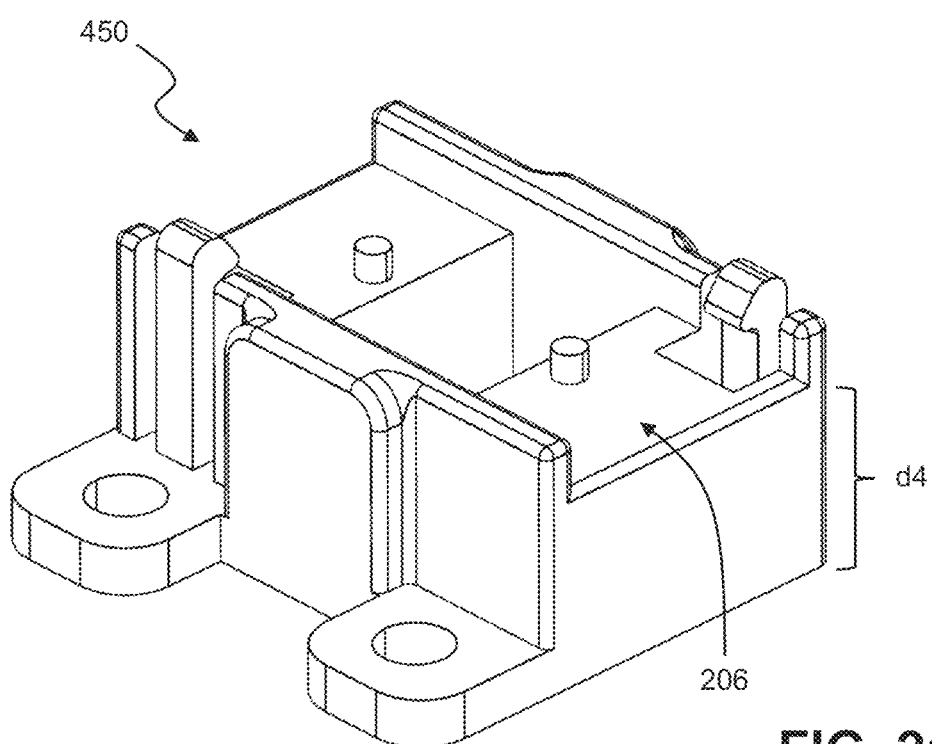
FIG. 21 is a top perspective view of an example PCB-to-surface mounting clip.

FIG. 20 shows a PCB-to-surface spacer clip 450. This clip 450 may be added to support the PCB light bars 100 when they are cut shorter and no longer extend between rails 250 (see e.g. PCBs 101 in FIG. 2). The design and function of the clip 450 in physically attaching to PCB 100 is essentially the same as the clip 200 and therefore not repeated here. As in the case of directly mounting clips 200 to a surface, the clip 450 may be installed on the mounting surface via fasteners (not shown) through holes 202, or with adhesives depending on the nature of the surface. It should be noted that the index pins 212 are located along the center line in this example, permitting 180-degree rotation of the clip 450 during installation. The distance d4 between the PCB channel surface 210 of clip 450 and the underlying mounting surface is designed to be the substantially the same as the distance between the channel surface 210 of clips 200 and the mounting surface with all intermediary components assembled (e.g. rail 250, clip 300). By way of example and not limitation, the depicted embodiment part may be injection molded with a thermal set resin. This clip 450 addresses installation issues relating to unsecured, free-hanging PCB light bar members and resulting uneven illumination, as low-profile illumination systems are commonly installed under a light diffuser sheet and uneven distances between the LEEs and diffuser media may result in brighter and dimmer areas. The example spacer clip 450 of FIG. 21 is the same as the clip 450 except that its PCB channel 206 designed to accommodate wider PCBs 100, namely 15 mm versus 10 mm in the depicted embodiments.

Figure 22A:
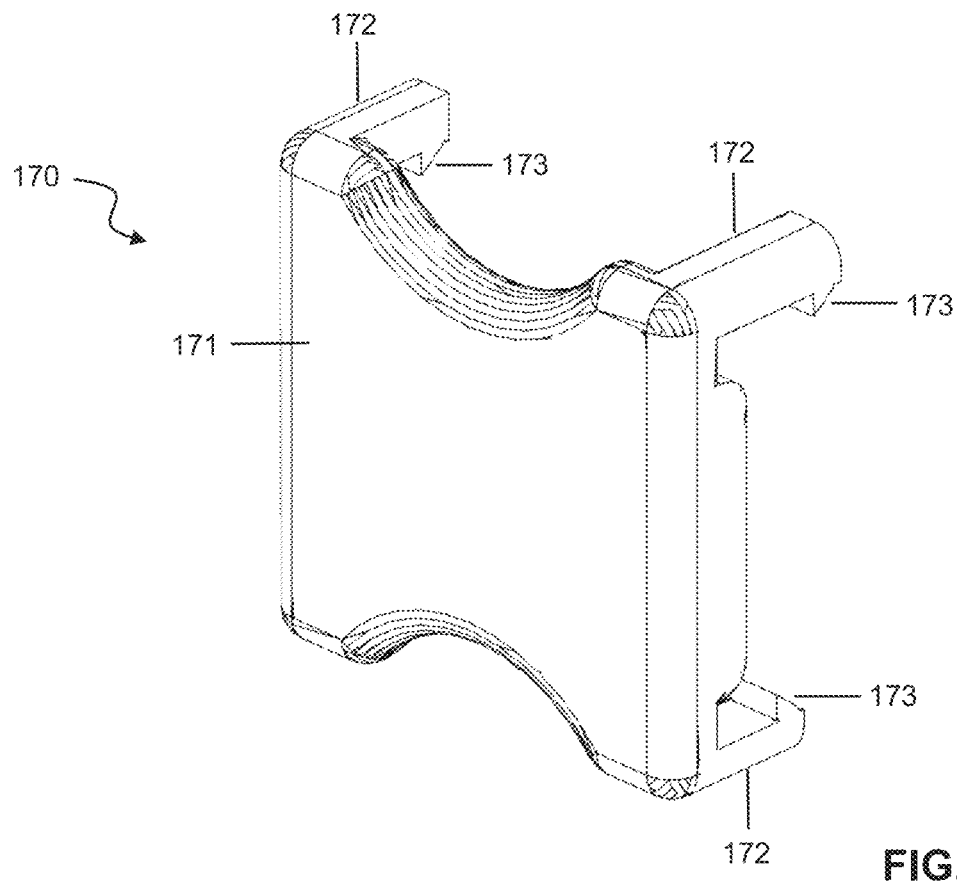
FIG. 22A is a perspective view of an example IDC clip.
Figure 22B:
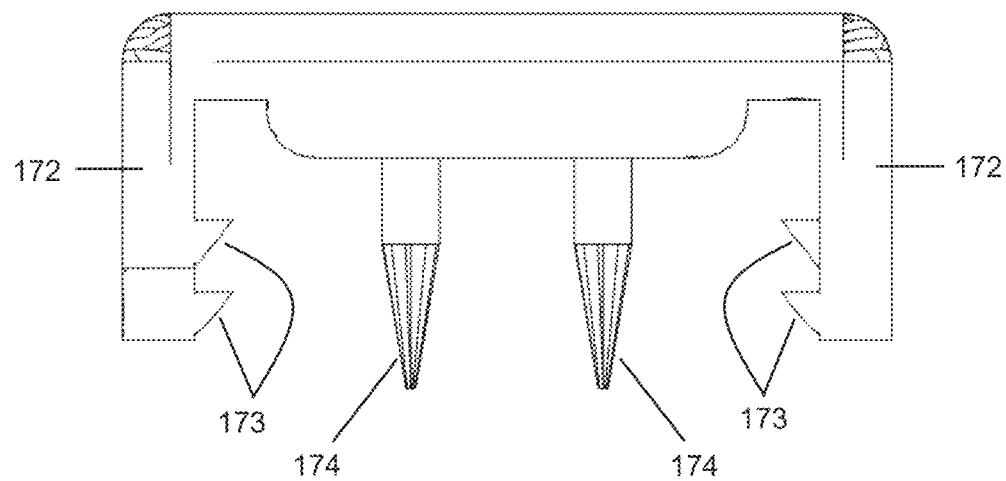
FIG. 22B is a side view thereof.

FIGS. 22A and 22B show an example IDC cap clip 170. The IDC clip 170 may be used as an alternative to conductive screws 850 for establishing electrical connections between the wires 60 and the PCB conductors. The clip 170 comprises a cover body 171 with four legs 172 extending from each corner. The legs 172 each carry a locking tab 173. As seen in FIG. 22B, the bottom of the clip 170 comprises two IDC swords, needles or blades 174 extending away from the cover body 171. It should be noted that the blades 174 do not extend through to the other side of the cover body 171. The blades 174 are made a conductive material such as copper or bronze; the remainder of the clip 170 is made of an insulating material such as plastic. The number of blades 174 corresponds to the number of wires 60 that will be pierced. In this example, there are two wires 60 and therefore two blades 174. Of course, clips 170 may have three or more blades 174 to connect to other circuit configurations as needed. For example, a cap clip 170 designed for the PCB circuitry of FIGS. 5A-5C comprises five blades 174. The positioning of the blades 174 is also selected in view of the PCB circuitry. For instance, the arrangement of blades 174 may correspond to the location of the holes 501-505 in FIGS. 5A-5C for the RGBW PCB. In this example, adjacent legs 172 have different lengths to assist the user in properly orienting with clip 200. However, the legs 172 could also be the same length or all different lengths, with corresponding modification to the clip slots 220. Visual indicators may be provided to guide the alignment during installation.

Figure 23:
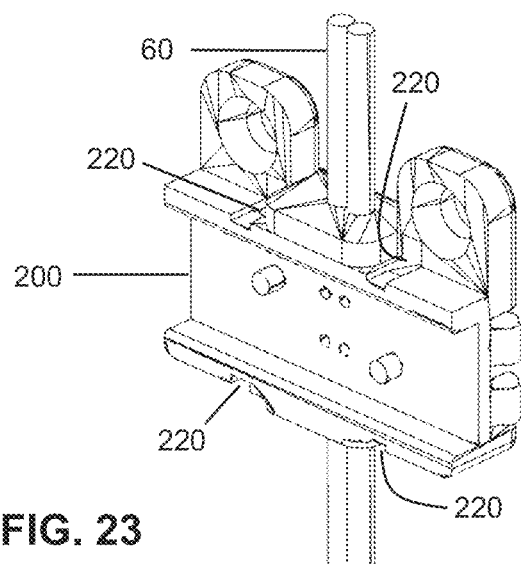
FIG. 23 is a perspective view of an example PCB clip for use with the clip of FIG. 22A.
Figure 24:
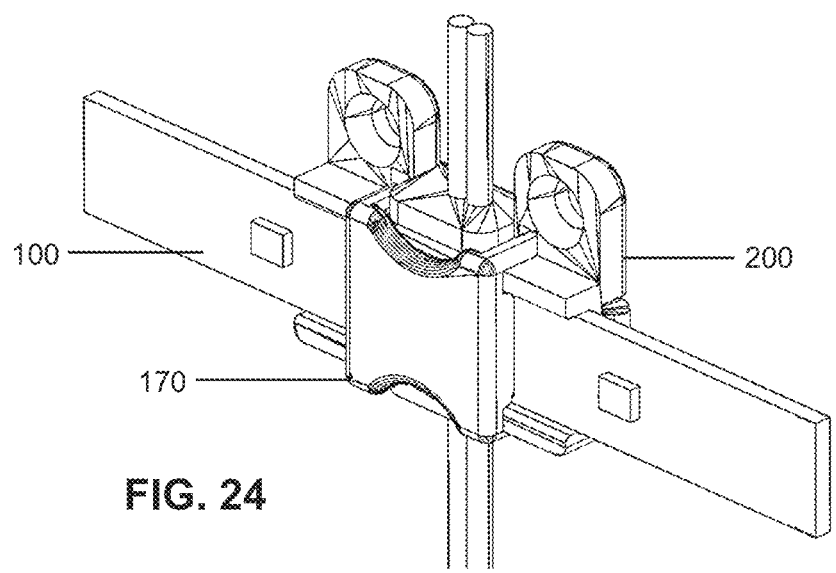
FIG. 24 shows the IDC clip of FIG. 22A connected to the clip of FIG. 23 with PCB securely retained therebetween.
Figure 25A:
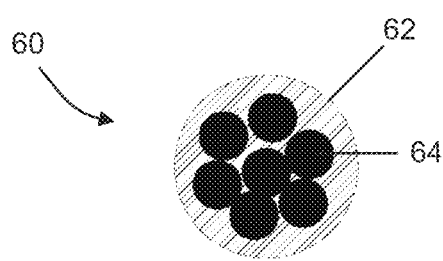
FIG. 25A is a schematic cross-sectional view of an unpierced wire.
Figure 25B:
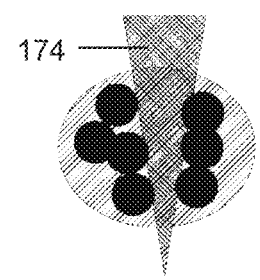
FIG. 25B shows the wire of FIG. 25A after being pierced by an IDC blade.
Figure 26A:
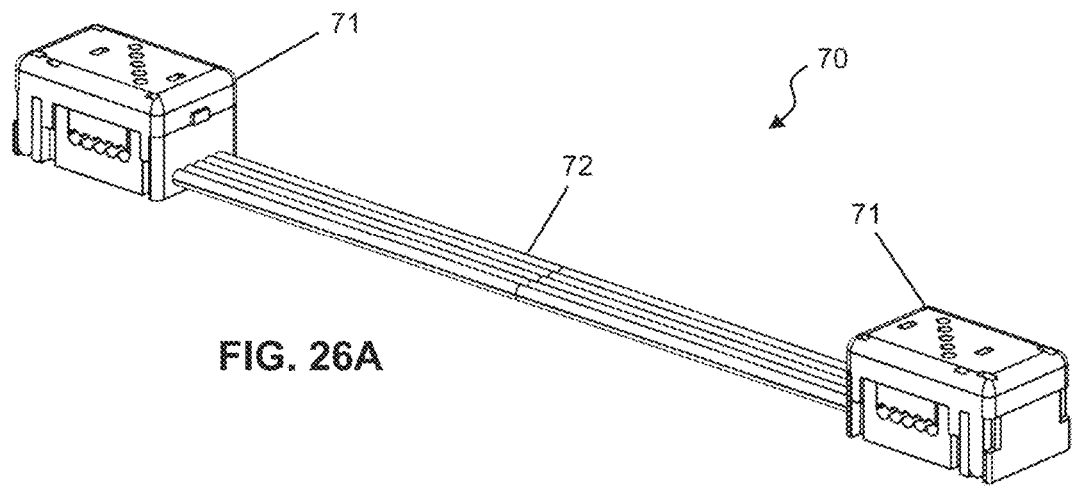
FIG. 26A is a perspective view of a power link cable (PLC) device for a five-cable system.
Figure 26B:
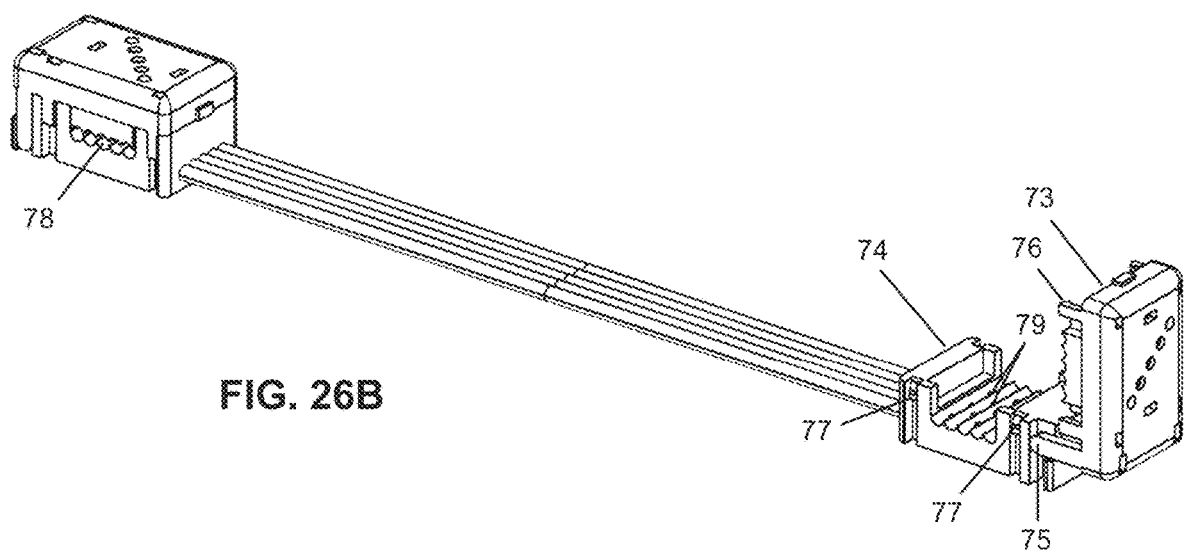
FIG. 26B shows the PLC device of FIG. 26A with one of the PLC blocks opened.
Figure 26C:
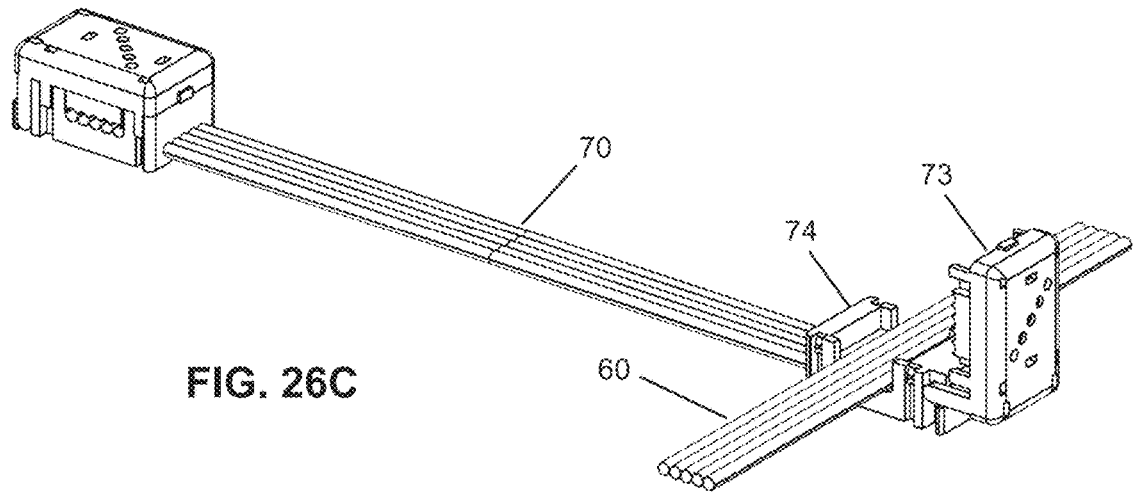
FIG. 26C shows the PLC device of FIG. 26B with wires inserted into the open PLC block.
Figure 26D:
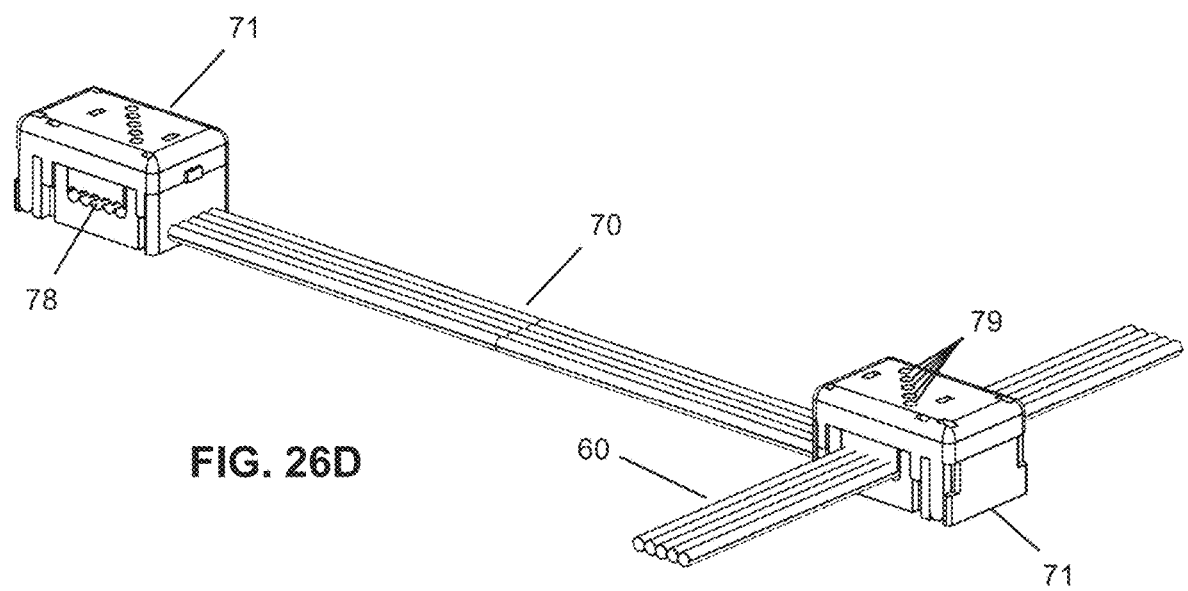
FIG. 26D shows the PLC device of FIG. 26C with both PLC blocks closed.
Figure 26E:
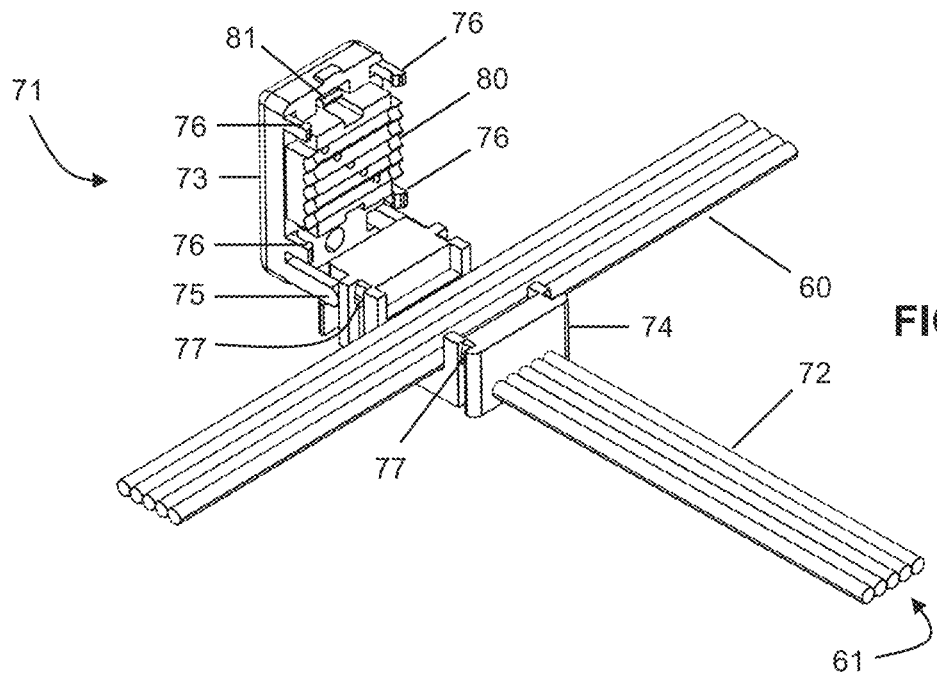
FIG. 26E is a different perspective view showing half the PLC device of FIG. 26C.
Figure 26F:
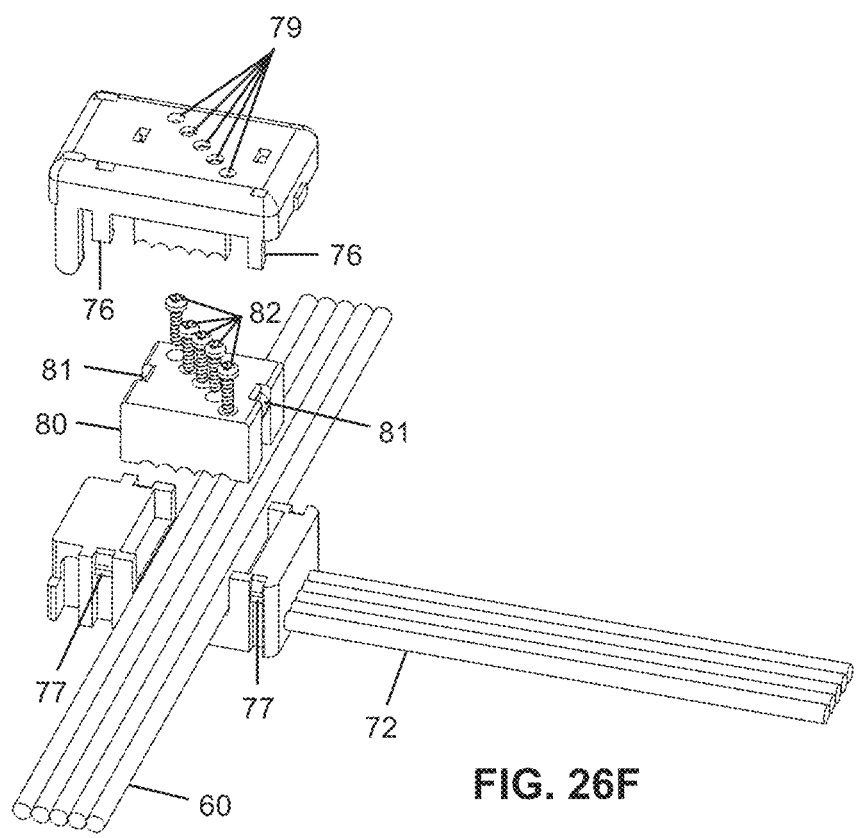
FIG. 26F is another perspective view of FIG. 26E with PLC block components exploded.

FIG. 23 shows a PCB adapter clip 200 designed for use with the IDC cap clip 170. Two wires 60 are preinstalled through the clip 200. The primary differences between this clip 200 and the clips 200 of FIGS. 10A-13C include: the addition of clip slots 220 which are configured to catch the tabs 173 of clip 170; and the removal of the PCB retention tabs 208 on the inner walls of the channel 206 which are unnecessary since the PCB 100 is held in position between the clips 170, 200 when coupled together as shown in FIG. 24. Of course, the retention tabs 208 could still be included with this example. Once the PCB 100 is mounted on the clip 200, the installer aligns the IDC clip 170 in position with the clip 200 and applies force until the tabs 173 snap lock into the corresponding slots 220, at which point the cap clip 170 is fully inserted and the wires 60 have been pierced by the blades 174. FIG. 25A shows one of the wires 60 in an unpierced state, wherein insulator 62 completely surrounds the conductive strands 64. FIG. 25B shows the wire 60 after being pierced by blade 174. As seen here, the conductors 64 are in contact with the blade 174, while compression forces from the displaced insulator 62 provide a gas-tight connection with the blade 174. The installation is done by hand and thus avoids the need for a precision screwdriver as with conductor screws 850. Therefore, although generally more expensive than the simple conductor screws, the IDC method is more convenient and provides better protection against corrosion. The IDC design may replace the screws in any of the embodiments previously described.

FIG. 26A-26F shows an accessory PLC device 70 for the backlight array system. In one application, the PLC device 70 can be used to establish an electrical connection between two separate arrays 50. In another application, the PLC device 70 can be installed at any location along the wires 60 of the array 50 and used to form the electrical connection to a power supply or control component. The PLC device 70 comprises two PLC blocks 71 connected by five wires 72. This example is designed for a backlight system 10 with four-color PCB bars 100 and thus five wires 60 (see e.g. FIGS. 5A-5C and 12A-12C). As the two PLC blocks 71 are identical in design, the following description provided in terms of one PLC block 71 applies equally to both. The PLC block 71 has two parts 73 and 74 which are pivotably connected to one another about hinge point 75. When closed, the parts 73 and 74 are snap locked together in the closed position by respective tabs 76 and catches 77. Wire conduit or hole 78 traverses the PLC block 71 to allow wires 60 to be run therethrough. The parts 73 and 74 define the profile of the wire conduit 78 which is formed when the parts 73, 74 are closed. Holes 79 extend through from the upper surface of the part 73 into the part 74 through to terminal wires 72. The part 73 carries screw housing 80 via tab attachments 81. The housing 80 holds screws 82 which are in line with the through-holes 79.

Figure 27:
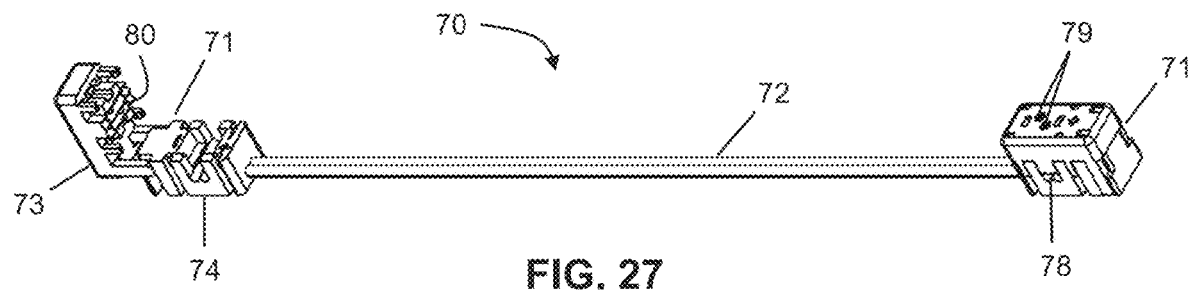
FIG. 27 is a perspective view of another example PLC device for a two-cable system.
Figure 28:
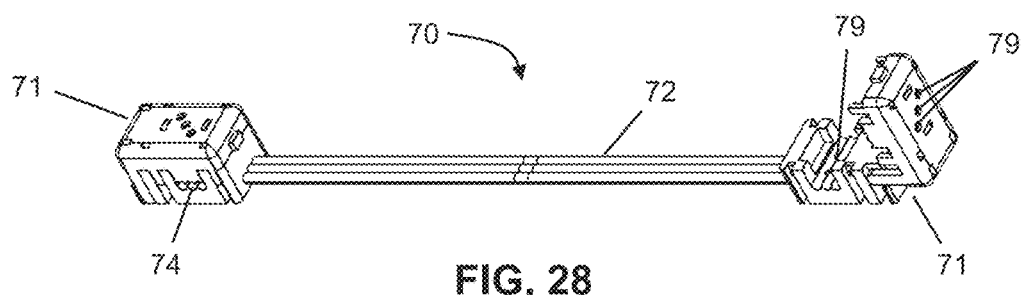
FIG. 28 is a perspective view of another example PLC device for a three-cable system.
Figure 29:
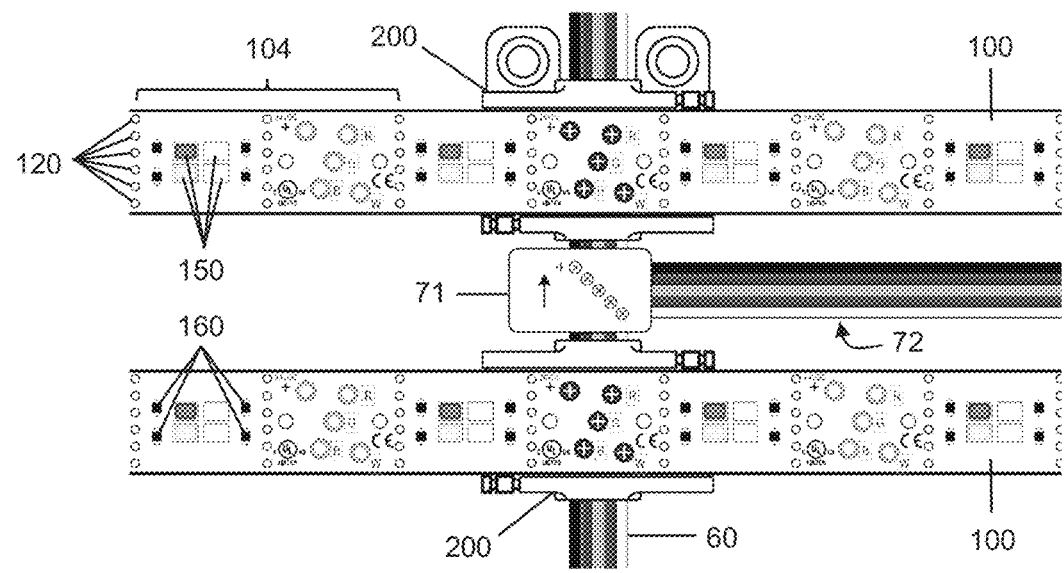
FIG. 29 is a front side view of a RGBW PCB system with PLC device connected.

FIG. 27 shows an example PLC device 70 for a system with single-color PCB bars 100 and thus two wires 60. FIG. 28 shows an example PLC device 70 for a system with two-color PCB bars 100 and thus three wires 60. The design and operation of these PLC devices 70 is substantially the same as PLC device 70 of FIGS. 26A-26F, except that the PLC wires 72, wire conduits 78, through-holes 79, and screws 82 are adapted for the different number of wires.

In a first application, the PLC device 70 is used for an array-to-array connection. For example, a first array 50 may be hooked up to a power source and the user desires to install a second array 50 adjacent to the first array 50. In this case, the PLC device 70 can be used to quickly and easily power the second array off the first array. For this setup, both PLC blocks 71 are opened. The wires 60 of one array are seated in one of the PLC blocks 71 and the wires 60 of the other array are seated in the other PLC block 71. The open PLC blocks 71 are closed into their snap-locked positions. The user then tightens the screws 82 to first pierce the array wires 60 and subsequently PLC wires 72 to establish an electrical connection between the array wires 60 and PLC wires 72. In this way, the otherwise separate arrays 50 may be simply and rapidly connected with the PLC device 70. It should be noted that the installation steps for both array wires 60 need not be undertaken in parallel; the user can fully install the PLC device 70 on one of the array wires 60 before repeating the process for the other.

In a second application, the PLC device 70 is used to provide power supply to one or more arrays 50 (e.g. if multiple arrays are hooked up together by additional PLC devices 70). In this case, one PLC block 71 is installed with the array wires 60 in the same manner above. However, the PLC wires 72 are cut at some point between the two PLC blocks 71, see e.g. example cut location 61 in FIG. 26E. The cut wire ends at 61 may then be stripped and connected to a compatible power supply or control component as needed. In this way, the user is able to connect one or more arrays 50 to power at virtually any location, rather than at the ends of the array wires 60 as previously. This provides additional system flexibility in accommodating the requirements of the installation space. Moreover, for longer rolls of arrays 50 in particular, the ability to connect the power input at the center of the roll via the PLC device 70 can be used to reduce or prevent significant voltage drop over distance compared to connecting the power input at one end of the roll or the other as previously.

FIG. 28 shows one PLC block 71 installed on wires 60 on a PCB array 50. The PLC block 71 may be connected at any location along the wires 60. This setup is the same regardless of whether the PLC device 70 is being used for an array-to-array connection or for a power source connection. The difference is whether PLC wires 72 attach to a set of wires 60 of another array 50 or whether the PLC wires 72 are connected to the power source. The wide customizability of the PCBs 100 should be highlighted here again. Each repeating PCB section 104 not only includes the four LEEs 150 but also the power connectors, such that the array wires 60 could be connected at any such position through the length of the PCB bar 100. Further, the LEEs 150 in any PCB segments 104 which have been broken off at perforations 120, such as e.g. to accommodate an obstacle, may also be repurposed in reconnecting the broken segments to a power supply via the redundant power connectors.

In another embodiment of the PLC device 70 (not shown), the through-holes 79 and screws 82 are replaced by IDC blades 174 (see FIGS. 22A-25B and accompanying description) which pierce through both sets of wires 60, 72. As discussed, this design is generally preferable in terms of convenience, since the user simply presses the part 73 carrying the IDC blades 174 into the locked position without needing to tighten multiple screws 82 to a specified depth using a micro screwdriver, as well as in terms of corrosion protection, since the wire insulators 62 form a gas-tight connection with the IDC blade 174 if properly aligned.

Figure 32:
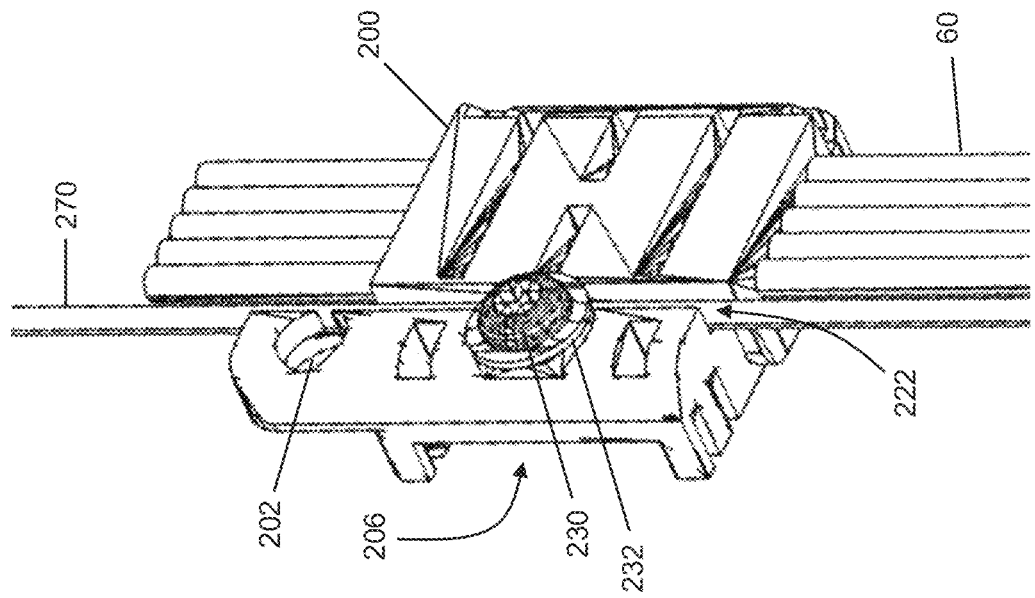
FIG. 32 is a bottom rear perspective view of the configuration of FIG. 31.
Figure 31:
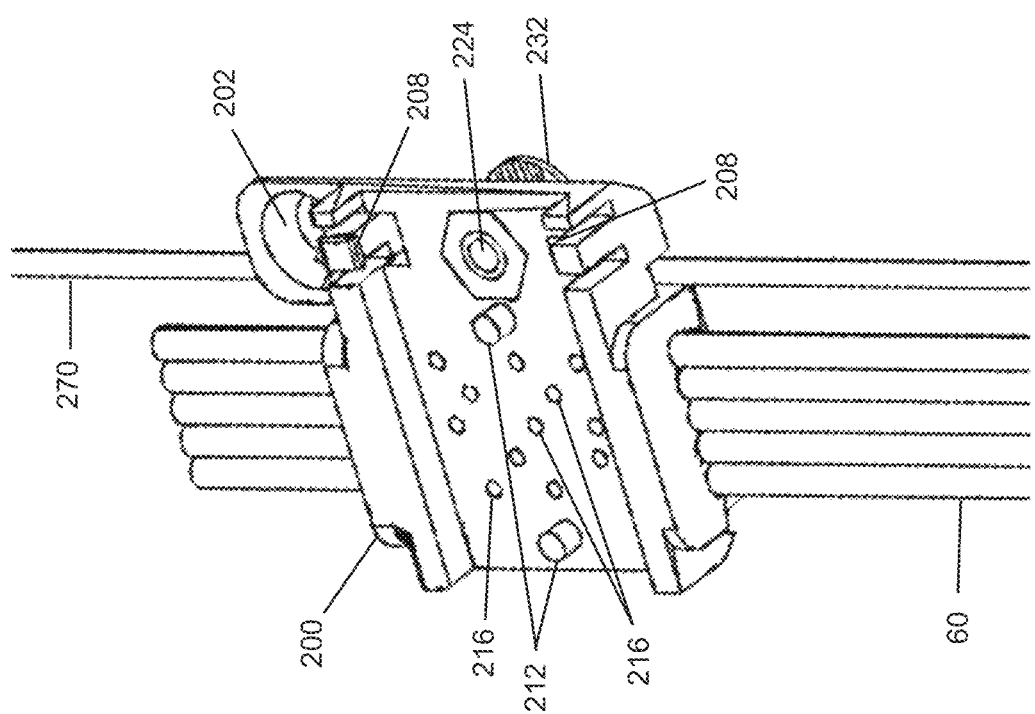
FIG. 31 is a bottom front perspective view of the cable with clip and wires of FIG. 30.

FIG. 30 shows another example backlight system 10 with the PCB array 50 mounted on cables 270 rather than rails 250. This design is particularly suited for vertical installations as well as two-way facing installations as described below. The cables 270 are attached at the top and bottom with common tensioners 272 (not shown). The cables 270 in this example are steel though other materials may also be used. Adapter clips 200 carrying the array wires 60 and PCBs 100 are mounted on the cables 270. Only a portion of the wires 60 and two PCBs 100 of the array 50 are shown here. The depicted example comprises four-color PCBs 100, but any other PCBs may be used with this design. Referring now to FIGS. 31 and 32, the PCB 100 snaps into clip 200 in a similar manner as described above with respect to FIGS. 10A-13C. The PCB channel 206 of the clip 200 includes index pins 212 which insert into corresponding index holes 129 of the PCB 100. The PCB 100 is held in place in a snap fit manner by retention clips 208 formed on either side of the channel walls. The clip 200 has one or more holes 202 for surface mounting via fasteners if needed. The array wires 60 extend through the wire conduit or hole 214 which traverses the body of clip 200. Holes 216 are provided to establish electrical communication between the wires 60 and PCB 100. However, this clip 200 further includes a cable slot 222 and cable mounting hole 224. The cable slot 222 receives the cable 270. The hole 224 receives the shank of fastener 230. A washer 232 is arranged on the fastener shank on the same side as the cable slot 222. To secure the clip 200 with respect to the cable 270, the fastener 230 is driven into hole 224 until the fastener 230 via the washer 232 conveys a strong clamping force onto the cable 270 within the slot 222 such that the clip 200 is positionally anchored on the cable 270. In the depicted example, the clip 200 only has the fastener hole 202, tabs 208, slot 222 and cable mounting hole 222 on one side. However, another embodiment has a symmetrical design with these structures on both sides. This allows either side of the clip 200 to be mounted to cable 270. The electrical connection between wires 60 and PCB 100 may be provided via conductive screws 850 or IDC blades 174, such as with an IDC cap clip 170 as described above in reference to FIGS. 22A and 22B.

As mentioned above, the backlight system 10 with cables 270 is particularly suited for dual-sided backlit displays. The thin cables 270 do not cast significant shadow, which could otherwise affect the uniformity of illumination on the diffuser media. In a two-sided backlight array 50 according to the present disclosure, the second redundant conductor layer (see layer 140 in FIGS. 3C and 5C, lower layer with conductors 812, 822 and 832 in FIGS. 7A and 7B) forms a middle layer. The outer circuitry is then mirrored on the other side of the PCB 100. For instance, taking the example of FIGS. 3A-3C, both sides would have layers 102 and 130 of FIGS. 3A and 3B respectively and be connected to common middle layer 140 of FIG. 3C. In this way, the two sides of the PCB are in electrical communication with one another and both benefit from the redundant conductor paths.

The terms and expressions employed herein are used as terms and expressions of description and not limitation, and there is no intention in the use of such terms and expressions of excluding any equivalents of the features and concepts shown and described or portions thereof, but it is recognized that numerous possible modifications and variations are possible within the scope of the claimed invention. Thus, it should be understood that although the invention has been specifically disclosed using preferred embodiments and concepts, those skilled in the art will recognize numerous possible modifications and variations thereof, without same needing to be specifically explained or shown in the context of this disclosure, and that such modifications and variations are considered within the scope of the claimed invention. Whenever a range is given in the specification, all intermediate ranges and subranges, as well as all individual values included in the ranges given, are fully incorporated in this disclosure.

In general, the terms and phrases used herein have their art-recognized meaning, which can be found by reference to standard texts, references and contexts known to those skilled in the art. The above definitions are provided to clarify their specific use in the context of the disclosure.

The invention claimed is:

1. A backlight system comprising:
   a printed circuit board (PCB) array comprising PCBs and PCB-mounting clips, each PCB designed as a bar having a length extending in a x direction which corresponds to a longitudinal extension of the PCB, a width extending in a y direction which is perpendicular to the x direction, and a thickness extending in a z direction, wherein the PCBs are arranged spaced apart from each other in the y direction, wherein each PCB is mounted to a first PCB-mounting clip and a second PCB-mounting clip which are arranged spaced apart from one another along the PCB in the x direction, with each PCB-mounting clip comprising a PCB clip channel configured to receive the PCB, and wherein the PCBs are connected together by wires running through a first set of the PCB-mounting clips in the y direction and by wires running through a second set of the PCB-mounting clips in the y direction, and wherein the wires are in electrical communication with the PCBs;
   wherein each PCB is formed of repeating sections along the x direction with break lines therebetween, each repeating section having at least one light emitting element (LEE) with a resistor connected in series forming a circuit, wherein each PCB comprises a first conductor layer and a second conductor layer arranged underneath the first conductor layer in the z direction, the first and second conductor layers extend throughout the length of the PCB across the repeating sections, with the second conductor layer providing redundant circuitry to first conductor layer, wherein vias extending in the z direction provide electrical communication between the first conductive layer and the second conductive layer in each repeating section of the PCB, and wherein a breaking off of one or more of the repeating sections along one of the break lines maintains power to the LEEs in a remaining set of the repeating sections; and
   a mounting system for mounting the PCB array, the mounting system comprising rails and surface-mounting clips, wherein each rail comprises a rail channel configured to receive the PCB-mounting clips in a snap-fit manner, and wherein each surface-mounting clip comprises a surface clip channel configured to receive the rails in a snap-fit manner, with the surface-mounting clips configured to mount to a surface.

2. The backlight system of claim 1, wherein at least one sidewall of the PCB clip channel of each PCB-mounting clip has a retention clip facing the PCB clip channel, and the retention clip is configured to retain the PCB in the PCB clip channel in a snap-fit manner.

3. The backlight system of claim 1, wherein each PCB-mounting clip comprises mounting pins for positioning the PCB thereon, the mounting pins extending from a surface of the PCB clip channel in the z direction, and each PCB comprises complimentary mounting holes formed in the z direction, and wherein the mounting pins are inserted in the mounting holes.

4. The backlight system of claim 3, wherein each repeating section of the PCB has the complimentary mounting holes such that each repeating section is mountable to the PCB-mounting clip.

5. The backlight system of claim 1, wherein the first and second conductor layers of the PCBs are in electrical communication with the wires via conductive screws or insulation displacement connectors (IDCs) which extend through the PCBs in the z direction, and wherein each PCB-mounting clip comprises holes extending through a surface of the PCB clip channel in the z direction, the holes corresponding in number and position to the wires running through the PCB-mounting clip, and the conductive screws or IDCs extend through the holes from the PCBs and pierce the wires.

6. The backlight system of claim 5, wherein IDCs provide the electrical communication between the wires and PCBs, the backlight system further comprising IDC cap clips connected to the PCB-mounting clips over the PCBs, and each IDC cap clip comprises a cover body which carries the IDCs on a side thereof facing the PCB.

7. The backlight system of claim 6, wherein each IDC cap clip comprises legs extending from the cover body which carry retention tabs that interface with complimentary clip slots of the PCB-mounting clip in a snap-fit manner.

8. The backlight system of claim 1, wherein each PCB-mounting clip comprises one or more wire conduits which extend through a body of the PCB-mounting clip, and the wires are run through the one or more wires conduits in connecting the PCB-mounting clips together.

9. The backlight system of claim 1, wherein each PCB-mounting clip comprises one or more fastener holes or slots for mounting the PCB-mounting clip to the surface via fasteners.

10. The backlight system of claim 1, wherein each rail comprises snap channels formed on opposing inner sides of the rail channel, and each PCB-mounting clip comprises complimentary protrusions which extend from opposite outer sides of the PCB-mounting clip, and wherein the snap channels of the rails interface with the protrusions of the PCB-mounting clips to retain the PCB-mounting clips in the rails in the snap-fit manner.

11. The backlight system of claim 1, wherein each rail comprises snap channels formed on opposite outer sides of the rail, and each surface-mounting clip comprises complimentary protrusions which extend from opposing inner sides of the surface clip channel, and wherein the snap channels of the rails interface with the protrusions of the surface-mounting clips to retain the rails in the surface-mounting clips in the snap-fit manner.

12. The backlight system of claim 1, wherein each surface-mounting clip comprises one or more fastener holes or slots for mounting the surface-mounting clip to the surface via fasteners.

13. The backlight system of claim 1, wherein the rails in longitudinal extension are provided with the same length as the PCBs.

14. The backlight system of claim 1, further comprising at least one rail connector clip for connecting two rails together such that the rail channels of the two rails form a continuous rail channel, wherein the rail connector clip has a rail connector channel with complimentary cross-sectional geometry to the rails, and a bottom of the rail connector channel comprises two flexible arm members extending in opposite directions, which arm members each carry a protrusion configured to insert into complimentary holes formed in a bottom of the rails in a snap-in manner.

15. The backlight system of claim 1, further comprising at least one rail end clip for retaining an end of the rail in vertical installations, wherein the rail end clip comprises a cavity with complimentary cross-sectional geometry to the rails, and wherein the rail end clip comprises mounting flanges extending in at least two directions and carrying fastener holes or slots for mounting the rail end clip to one or more surfaces via fasteners.

16. The backlight system of claim 15, wherein the rail end clip further comprises a flexible arm member extending within or adjacent the cavity, and the arm member carries a protrusion configured to insert into a complimentary hole formed in a bottom of the rail in a snap-in manner such that the end of the rail is retained in the cavity of the rail end clip.

17. The backlight system of claim 1, wherein one or both ends of each PCB has a plus and a minus connector for power distribution.

18. The backlight system of claim 1, wherein the break lines are provided by perforations or scoring of the PCBs in the z direction.

19. The backlight system of claim 1, wherein at least some of the LEEs have diffuser lenses arranged thereover.

20. The backlight system of claim 1, wherein the LEEs are light emitting diodes.

\* \* \* \* \*